(12) United States Patent
Yajima et al.

(10) Patent No.: US 11,157,805 B2
(45) Date of Patent: Oct. 26, 2021

(54) NEURON CIRCUIT, SYSTEM, AND SWITCH CIRCUIT

(71) Applicant: JAPAN SCIENCE AND TECHNOLOGY AGENCY, Kawaguchi (JP)

(72) Inventors: Takeaki Yajima, Tokyo (JP); Akira Toriumi, Tokyo (JP)

(73) Assignee: JAPAN SCIENCE AND TECHNOLOGY AGENCY, Kawaguchi (JP)

(*) Notice: Subject to any disclaimer, the term of this patent is extended or adjusted under 35 U.S.C. 154(b) by 315 days.

(21) Appl. No.: 16/464,472

(22) PCT Filed: Jul. 18, 2017

(86) PCT No.: PCT/JP2017/025932
§ 371 (c)(1),
(2) Date: May 28, 2019

(87) PCT Pub. No.: WO2018/100790
PCT Pub. Date: Jun. 7, 2018

(65) Prior Publication Data
US 2019/0378002 A1  Dec. 12, 2019

(30) Foreign Application Priority Data
Nov. 30, 2016 (JP) .............................. JP2016-233444

(51) Int. Cl.
*G06N 3/063* (2006.01)
*G11C 11/54* (2006.01)
(Continued)

(52) U.S. Cl.
CPC .............. *G06N 3/063* (2013.01); *G11C 11/54* (2013.01); *G11C 13/0004* (2013.01); *H01L 49/02* (2013.01)

(58) Field of Classification Search
None
See application file for complete search history.

(56) References Cited

U.S. PATENT DOCUMENTS

| 6,141,241 A | 10/2000 | Ovshinsky et al. |
| 2019/0130258 A1* | 5/2019 | Cappy .................... G06N 3/049 |
| 2021/0103801 A1* | 4/2021 | Roy ......................... G06N 3/08 |

FOREIGN PATENT DOCUMENTS

| JP | 5-89268 A | 4/1993 |
| JP | 6-20074 A | 1/1994 |
| JP | 2002-541613 A | 12/2002 |

OTHER PUBLICATIONS

International Search Report dated Aug. 22, 2017, issued in counterpart application No. PCT/JP2017/025932, w/ English translation (5 pages).
(Continued)

*Primary Examiner* — Benjamin P Sandvik
(74) *Attorney, Agent, or Firm* — Westerman, Hattori, Daniels & Adrian, LLP

(57) ABSTRACT

A neuron circuit includes: an input terminal to which spike signals are continuously input; a first switch element that has a first end coupled to the input terminal and a second end coupled to a node, remains in a high resistance state even when a single spike signal is input, and goes into a low resistance state when spike signals are input within a time period; a feedback circuit coupled to the node, and causing the input terminal to be at a level when the first switch element goes into the low resistance state; and a second switch element that is connected in series with the first switch element between the input terminal and the node, remains in a low resistance state even when spike signals are input to the input terminal, and goes into a high resistance state when the input terminal becomes at the level.

14 Claims, 29 Drawing Sheets

(51) Int. Cl.
*G11C 13/00* (2006.01)
*H01L 49/02* (2006.01)

(56) References Cited

OTHER PUBLICATIONS

Written Opinion Report dated Aug. 22, 2017, issued in counterpart application No. PCT/JP2017/025932 (4 pages).
Liu et al., "Co-Occurrence of Threshold Switching and Memory Switching in Pt/NbOx/Pt Cells for Crosspoint Memory Applications", IEEE Electron Device Letters, Feb. 2012, vol. 33, No. 2, pp. 236-238, (3 pages).
Son et al., "Self-Selective Characteristics of Nanoscale VOx Devices for High-Density ReRAM Applications", IEEE Electron Device Letters, May 2012, vol. 33, No. 5, pp. 718-720, (3 pages).
Shenoy et al., "MIEC (mixed-ionic-electronic-conduction)-based access devices for non-volatile crossbar memory arrays", Semiconductor Science and Technology, 2014, 29, pp. 104005-1 to 104005-11, (12 pages).
Kau et al., "A stackable cross point phase change memory", IEDM09-617, IEEE, 2009, pp. 27.1.1-27.1.4, (4 pages).
Ho et al., "Threshold Vacuum Switch (TVS) on 3D-Stackable and 4F$^2$ Cross-Point Bipolar and Unipolar Resistive Random Access Memory", IEDM12-40, IEEE, 2012, pp. 2.8.1-2.8.4, (4 pages).
Jo et al., "Cross-Point Resistive RAM Based on Field-Assisted Superlinear Threshold Selector", IEEE Transactions on Electron Devices,Nov. 2015, vol. 62, No. 11, pp. 3477-3481, (5 pages).
Hickmott, "Low-Frequency Negative Resistance in Thin Anodic Oxide Films", Journal of Applied Physics, Sep. 1962, vol. 33, No. 9, pp. 2669-2682, (15 pages).
Chen et al., "Negative differential resistance effect in organic devices based on an anthracene derivative", Applied Physics Letters, 2006, vol. 89, pp. 083514-1 to 083514-3, (4 pages).
Li et al., "Observation of N-Shaped Negative Differential Resistance in GaAs-Based Modulation-Doped Field Effect Transistor with InAs Quantum Dots", Japanese Journal of Applied Physics, 2010 vol. 49, pp. 104002-1 to 104002-5, (6 pages).
Wuttig et al., "Phase-change materials for rewriteable data storage", Nature Materials, Nov. 2007, vol. 6, pp. 824-832, (10 pages).
Waser et al., "Redox-Based Resistive Switching Memories—Nanoionic Mechanisms, Prospects, and Challenges", Advanced Materials, 2009, vol. 21, pp. 2632-2663, (32 pages).
Yajima et al., "Fabrication of Phase-Transition Neuron Firing by Joule Heat Accumulation", The 64th JSAP Spring Meeting Lecture Abstracts, The Japan Society of Applied Physics, Mar. 2017, pp. 12-239, w/English translation (3 pages).
Yajima et al., "Functional Passive Material VO$_2$ for Analogue Signal Processing with High-Speed, Low Power, and Robust Performance", 2016 IEEE International Electron Devices Meeting (IEDM), Dec. 3-7, 2016, pp. 34.4.1-34.4.4 (4 pages).

\* cited by examiner

NEURON CIRCUIT, SYSTEM, AND SWITCH CIRCUIT

TECHNICAL FIELD

The present invention relates to a neuron circuit, a system, and a switch circuit.

BACKGROUND ART

There has been known a switch element that is in a high resistance state when no voltage is applied, goes into a low resistance state when a voltage is applied, and voluntarily returns to a high resistance state when a voltage is cut (for example, Non-Patent Documents 1 through 6). There has been known a switch element having a negative resistance (for example, Non-Patent Documents 7 through 11).

PRIOR ART DOCUMENT

Non-Patent Document

Non-Patent Document 1: IEEE ELECTRON DEVICE LETTERS, VOL. 33, No. 2, pp. 236-238 (2012)
Non-Patent Document 2: IEEE ELECTRON DEVICE LETTERS, VOL. 33, No. 5, pp. 718-720 (2012)
Non-Patent Document 3: Semicond. Sci. Technol. 29 pp. 104005-1 to 104005-11 (2014)
Non-Patent Document 4: IEDM pp. 27.1.1-27.1.4 (2009)
Non-Patent Document 5: IEDM pp. 2.8.1-2.8.4 (2012)
Non-Patent Document 6: IEEE TRANSACTIONS ON ELECTRON DEVICES, Vol. 62, No. 11 pp. 3477-3481 (2015)
Non-Patent Document 7: JOURNAL OF APPLIED PHYSICS Vol. 33, No. 9, pp. 2669-2682 (1962)
Non-Patent Document 8: APPLIED PHYSICS LETTERS Vol. 89, pp. 083514-1 to 083514-3 (2006)
Non-Patent Document 9: Japanese Journal of Applied Physics Vol. 49, pp. 104002-1 to 104002-5 (2010)
Non-Patent Document 10: Nature Materials Vol. 6, pp. 824-832 (2007)
Non-Patent Document 11: Advanced Materials Vol. 21, pp. 2632-2663 (2009)

SUMMARY OF THE INVENTION

Problem to be Solved by the Invention

These switch elements are mainly applied to access elements of crossbar array memories. However, the application to other electronic circuits has been hardly examined.

The present invention has been made in view of the above problems, and aims to provide an electronic circuit using a switch element.

Means for Solving the Problem

The present invention is a neuron circuit including: an input terminal to which spike signals are continuously input; a first switch element that has a first end coupled to the input terminal and a second end coupled to an intermediate node, remains in a high resistance state even when a single spike signal is input, and goes into a low resistance state, of which a resistance value is lower than that of the high resistance state, when a plurality of spike signals are input within a first time period; a feedback circuit coupled to the intermediate node, and causing the input terminal to be at a predetermined level when the first switch element goes into the low resistance state; and a second switch element that is connected in series with the first switch element between the input terminal and the intermediate node, remains in a low resistance state even when one or more spike signals are input to the input terminal, and goes into a high resistance state when the input terminal becomes at a predetermined level.

In the above configuration, a load connected between the intermediate node and a reference potential terminal may be provided.

In the above configuration, the predetermined level may be a high level.

In the above configuration, the first switch element may include a resistor that is connected between the first end and the second end, is in a high resistance state when an internal state quantity that is an average of a voltage applied to the first end with respect to the second end within a second time period is less than a first threshold value, and is in a low resistance state when the internal state quantity is greater than a second threshold value.

In the above configuration, the resistor may be in a metallic phase at a predetermined temperature or greater and in an insulator phase at the predetermined temperature or less, and the internal state quantity may be an RMS of the voltage applied to the first end with respect to the second end within the second time period.

In the above configuration, the first switch element may include a resistor that is connected between the first end and the second end, is in a high resistance state when an internal state quantity is less than a first threshold value, and is in a low resistance state when the internal state quantity is greater than a second threshold value, and the internal state quantity $S(T_0)$ at time $T_0$ may be $$S(T_0) = \int_0^{T_0} f(V_{10}(T_0-T)) e^{-T/\tau_{dec}} dT$$

where a voltage between the first end and the second end is represented by $V_{10}$, an effect of $V_{10}$ on the internal state quantity is represented by $f(V_{10})$, and a relaxation time of the internal state quantity is represented by $\tau_{dec}$.

In the above configuration, the resistor may be in a metallic phase at a predetermined temperature or greater and in an insulator phase at the predetermined temperature or less, and $f(V_{10}) = A \times V_{10}^2$ where A represents a constant.

In the above configuration, the resistor may be formed of vanadium oxide.

In the above configuration, a third switch element that is connected in series with the first switch element and the second switch element between the input terminal and the intermediate node, remains in a high resistance state even when a single spike signal is input, and goes into a low resistance state when a plurality of the spike signals are input within a third time period may be provided.

In the above configuration, a resistance value of the high resistance state of the third switch element may be higher than a resistance value of the high resistance state of the first switch element, and a resistance value of the low resistance state of the third switch may be lower than a resistance value of the high resistance state of the first switch element.

The present invention is a system including: the above neuron circuits; and a synaptic circuit connecting the neuron circuits.

The present invention is a switch circuit including: an input terminal to which an input signal is input; an output terminal; and a switch element including: a first end coupled to the input terminal, a second end coupled to the output terminal, and a resistor that is connected between the first end and the second end, is in a high resistance state when an internal state quantity is less than a first threshold value, is in a low resistance state, of which a resistance value is less than that of the high resistance state, when the internal state quantity is greater than a second threshold value, wherein the internal state quantity $S(T_0)$ at time $T_0$ is $$S(T_0)=\int_0^{T_0} f(V_{10}(T_0-T))e^{-T/\tau_{dec}}dT$$

where a voltage between the first end and the second end is represented by $V_{10}$, an effect of $V_{10}$ on an internal state quantity is represented by $f(V_{10})$, and a relaxation time of the internal state quantity is represented by $\tau_{dec}$, and a cycle period of variation in the input signal is shorter than the relaxation time.

In the above configuration, the input signal may be a plurality of spike signals, and an interval of the plurality of spike signals may be shorter than the relaxation time.

In the above configuration, the resistor may be in a metallic phase at a predetermined temperature or greater and in an insulator phase at the predetermined temperature or less, and $f(V_{10})=A \times V_{10}^2$ where A represents a constant.

Effects of the Invention

The present invention is able to provide an electronic circuit using a switch element.

MODES FOR CARRYING OUT THE EMBODIMENTS

Hereinafter, with reference to the drawings, embodiments will be described.

First Embodiment

Figure 1A:
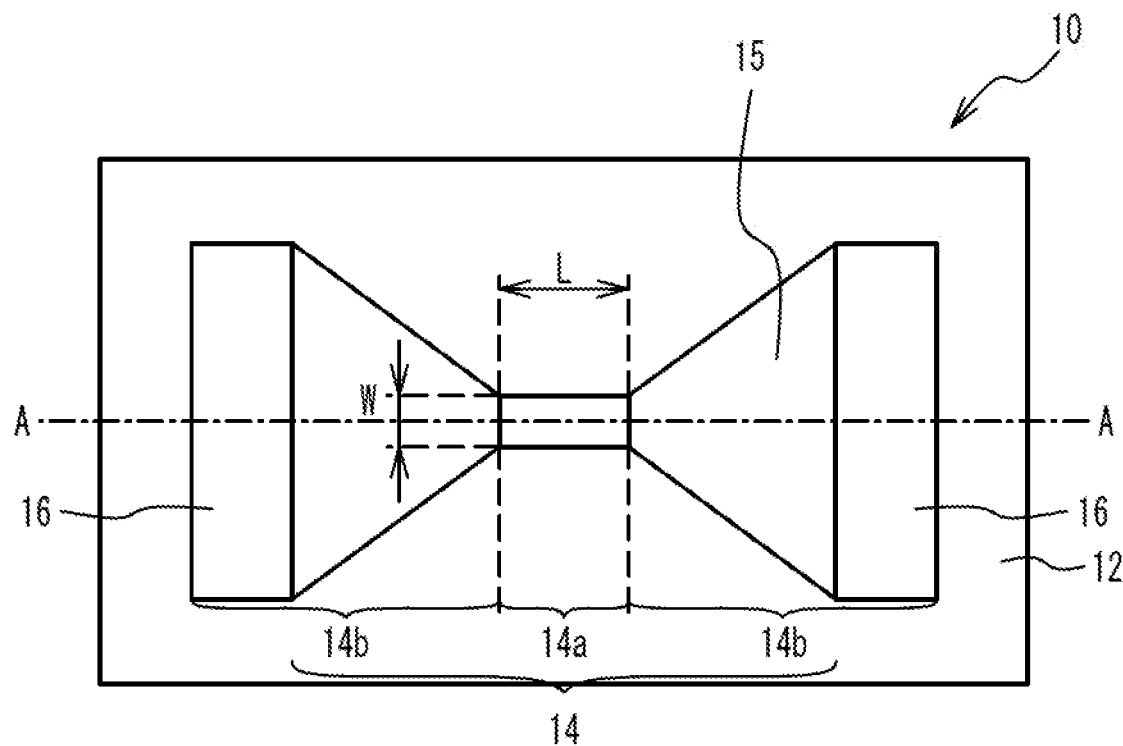
FIG. 1A is a plan view of a switch element in accordance with a first embodiment and FIG. 1B is a cross-sectional view taken along line A-A in FIG. 1A.
Figure 1B:
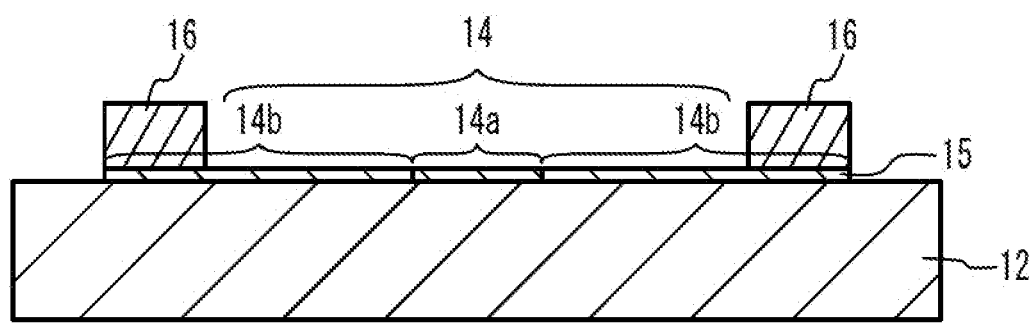

A first embodiment is an exemplary switch element. FIG. 1A is a plan view of a switch element in accordance with the first embodiment, and FIG. 1B is a cross-sectional view taken along line A-A in FIG. 1A. As illustrated in FIG. 1A and FIG. 1B, a switch element 10 includes a substrate 12, a resistor 14, and electrodes 16. A thin film 15 made of the resistor 14 is formed on the substrate 12. The electrodes 16 are formed on bath ends of the resistor 14. The resistor 14 has an active portion 14a and extraction portions 14b. The length of the active portion 14a in the direction in which a current flows is represented by L, and the width is represented by W. The extraction portion 14b electrically connects the active portion 14a and the electrode 16. The width of the extraction portion 14b gradually increases from the active portion 14a to the electrode 16. The voltage between the electrodes 16 mainly concentrates on the active portion 14a. Thus, the change in resistance of the switch element 10 mainly corresponds to the change in resistance of the active portion 14a.

The substrate 12 is an insulator substrate such as, for example, a titanium oxide ($TiO_2$) substrate or an aluminum oxide ($Al_2O_3$) substrate. The substrate 12 may be any substrate on which the resistor 14 having desired characteristics can be formed. The resistor 14 is formed of, for example, a vanadium oxide ($VO_2$) thin film. The electrode 16 is formed of a metal such as, for example, a gold (Au) layer, a copper (Cu) layer, or an aluminum (Al) layer.

It is sufficient if the resistor 14 is formed of a material of which the resistance is low when a high voltage is applied between the electrodes 16 (for example, the temperature of the resistor 14 is high), and is high when a low voltage is applied (the temperature of the resistor 14 is low). For example, $VO_2$ is in an insulator phase having a monoclinic crystal structure at low temperature and is in a metallic phase having a tetragonal crystal structure at high temperature. The phase transition temperature of $VO_2$ is from 10° C. to 80° C. The phase transition temperature of $VO_2$ differs depending on the oxygen composition ratio, the type and the concentration of impurities, the growth condition and/or the type of the substrate 12 (for example, a $TiO_2$ substrate having the (001) face as the principal surface, a $TiO_2$ substrate having the (101) face as the principal surface, and an $Al_2O_3$ substrate).

In the following examples, a $TiO_2$ substrate was used as the substrate 12, and $VO_2$ was formed as the resistor 14 by pulsed laser deposition. The film thickness of the resistor 14 was 90 nm, the length L of the active portion 14a was 10 μm, and the width W of the active portion 14a was 40 μm. Au was used as the electrodes 16.

Figure 2:
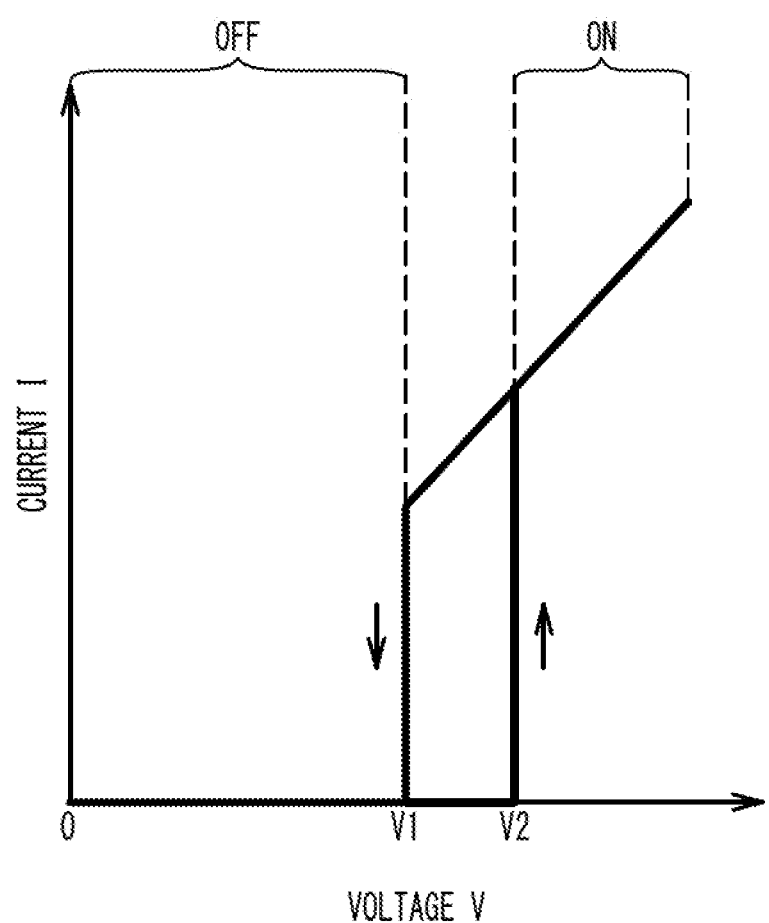
FIG. 2 is a schematic view illustrating the voltage-current characteristic of a direct current signal in the first embodiment.

First, a description will be given of voltage-current characteristics when a direct current (DC) voltage was applied to the switch element 10. FIG. 2 is a schematic view illustrating the voltage-current characteristic of a DC signal in the first embodiment. A current I flowing between the electrodes 16 with respect to a voltage V between the electrodes 16 is presented. As illustrated in FIG. 2, when the voltage V is low, the resistance of the switch element 10 is high. Iii this state, the switch element 10 is in an off state. When the voltage V is increased, the temperature of the active portion 14a rises because of joule heat at a voltage V2, and the phase of $VO_2$, of the active portion 14a transitions from an insulator phase to a metallic phase. Accordingly, the resistance of the switch element 10 decreases. In this state, the switch element 10 is an on state. When the voltage V is decreased, the temperature of the active portion Ma drops at a voltage V1 and the phase of $VO_2$ of the active portion Ma transitions from the metallic phase to the insulator phase. Accordingly, the switch element 10 is caused to be in the off state. The off state of the switch element 10 means the state where the resistance between the electrodes 16 (between a first end and a second end of the switch element 10) is high, and the on state of the switch element 10 means the state where the resistance between the electrodes 16 (between the first end and a second end of the switch element 10) is low.

Figure 3A:
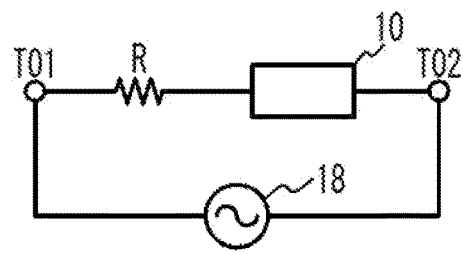
FIG. 3A illustrates a measurement circuit in the first embodiment.
Figure 3B:
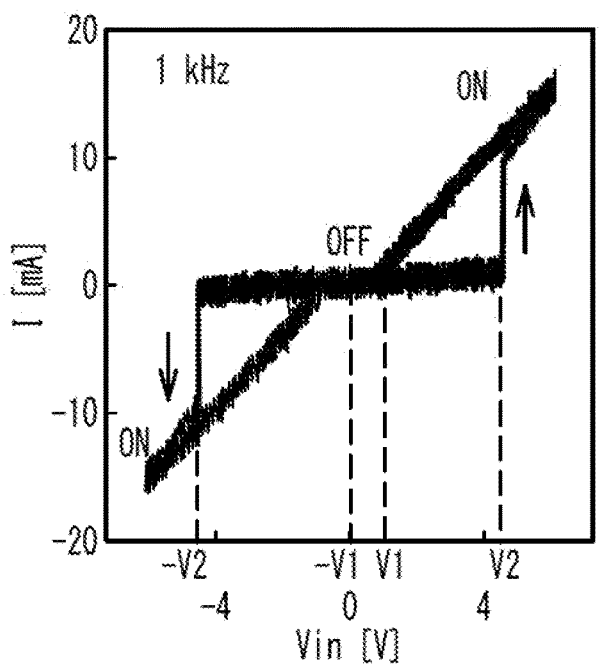
FIG. 3B and FIG. 3C illustrate the voltage-current characteristic of an alternate current signal in the first embodiment.
Figure 3C:
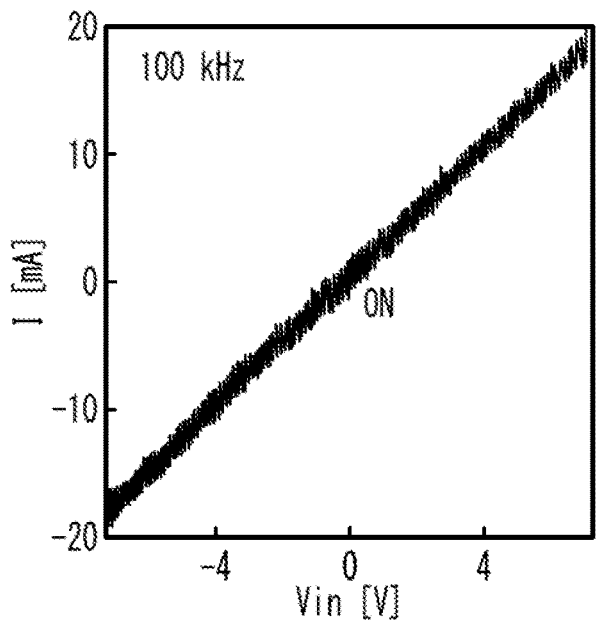

Next, a description will be given of voltage-current characteristics when an alternate current voltage is applied to the switch element 10. FIG. 3A illustrates a measurement circuit in the first embodiment, and FIG. 3B and FIG. 3C illustrate the voltage-current characteristic when an alternate current signal is applied in the first embodiment. As illustrated in FIG. 3A, the switch element 10 and a resistor R are connected in series between terminals T01 and T02. An alternate current source 18 is connected to the terminals T01 and T02. The alternate current source 18 applies an input voltage Vin, which is an alternate current of a substantially trigonometric function wave, between the terminals T01 and T02. The current I flowing through the switch element 10 is measured.

As illustrated in FIG. 3B, when the input voltage Viii has a frequency of 1 kHz, as in FIG. 2, the switch element 10 is in the on state when the absolute value of the input voltage Viii is V2 or greater, and the switch element 10 is in the off state when the absolute value of the input voltage Vin is V1 or less. As illustrated in FIG. 3C, when the alternate current voltage has a frequency of 100 kHz, the switch element 10 is in the on state regardless of the input voltage Vin.

The temperature of the active portion 14a is determined by the joule heat generated in the active portion 14a and the heat dissipation through the substrate 12 and the like. The time required for heat dissipation has a time constant that is determined by heat capacity, thermal resistance, and the like. At a low frequency as in FIG. 3B, the input voltage Vin changes in a longer time than the time constant of heat dissipation. For this reason, the temperature of the active portion 14a follows the change in the input voltage Vin. Thus, the state of the switch element 10 depends on the input voltage Vin. At a high frequency as in FIG. 3C, the input voltage Vin changes in a shorter time than the time constant of heat dissipation. Thus, the temperature of the active portion 14a is unable to follow the change in the input voltage Vin. Thus, the state of the switch element 10 is determined by the root mean square (RMS) of the input voltage Vin.

Figure 4A:
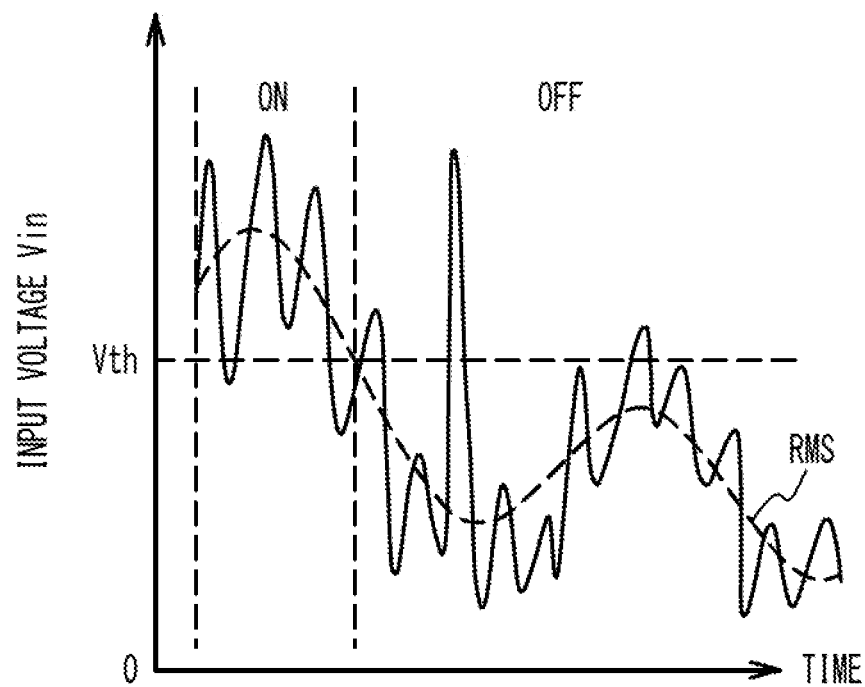
FIG. 4A and FIG. 4B illustrate input voltage with respect to time in the first embodiment.
Figure 4B:
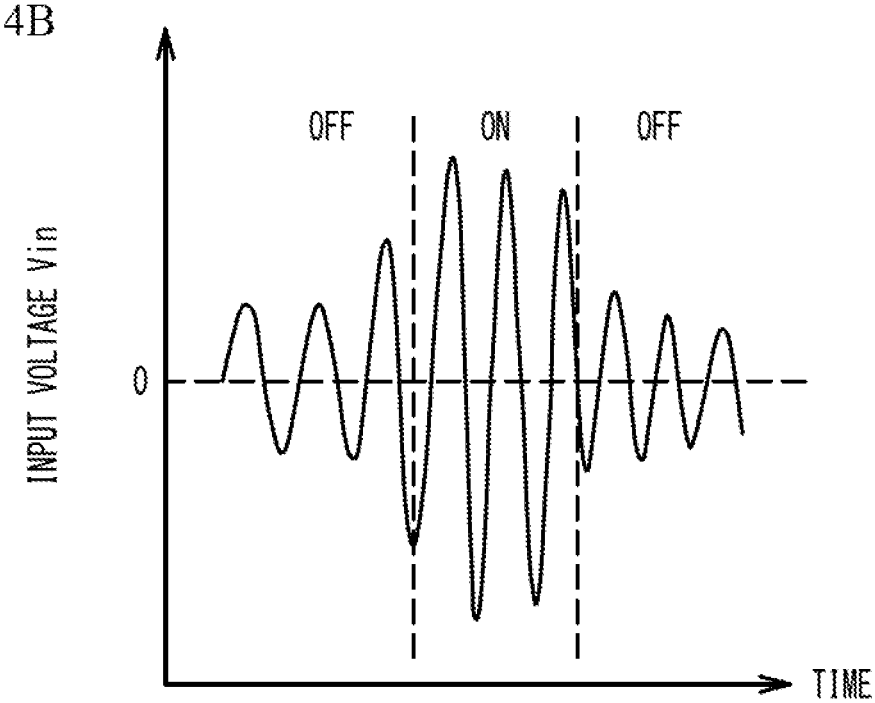

A case where the input voltage Vin has a waveform other than that of a trigonometric function wave will be considered. FIG. 4A and FIG. 4B illustrate the input voltage with respect to time in the first embodiment. As illustrated in FIG. 4A, the input voltage Vin indicated by a solid line arbitrarily varies with respect to time within a positive range. A dotted line indicates the RMS of the input voltage Vin within a predetermined time period corresponding to the time constant of heat dissipation. The switch element 10 is in the on state when the RMS is equal to or greater than a threshold value Vth, and is in the off state when the RMS is equal to or less than the threshold value Vth. As described above, the switch element 10 switches between the on state and the off state according to the RMS of the input voltage Vin within the predetermined time period.

As illustrated in FIG. 4B, the input voltage Vin indicated by a solid line is an alternate current voltage, and the amplitude thereof varies with respect to time. The period of the alternate current signal is shorter than the time constant of heat dissipation. When the amplitude is small, the RMS of the input voltage Vin is equal to or less than a threshold value. Thus, the switch element 10 is in the off state because the amount of heat generation of the active portion 14a is small, and the temperature of the active portion 14a is less than the phase transition temperature. When the amplitude is large, the RMS of the input voltage Vin is equal to or greater than the threshold value. Thus, the switch element 10 is in the on state because the amount of heat generation of the active portion 14a is large, and the temperature of the active portion 14a is greater than the phase transition temperature. As described above, the switch element 10 switches between the on state and the off state according to the amplitude of the input voltage Vin.

Figure 5A:
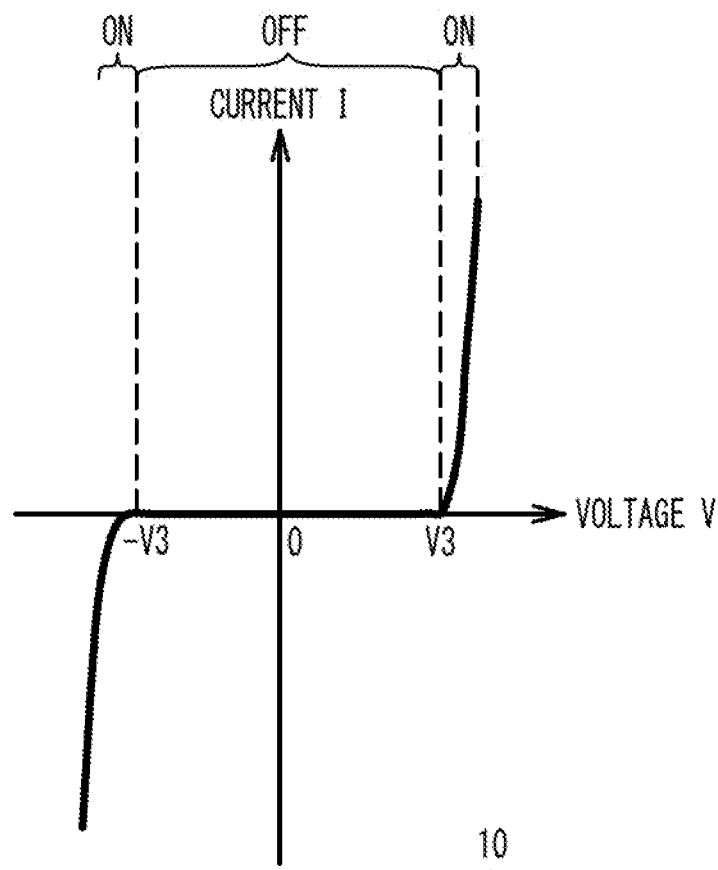
FIG. 5A illustrates another voltage-current characteristic of the switch element in accordance with the first embodiment.
Figure 5B:
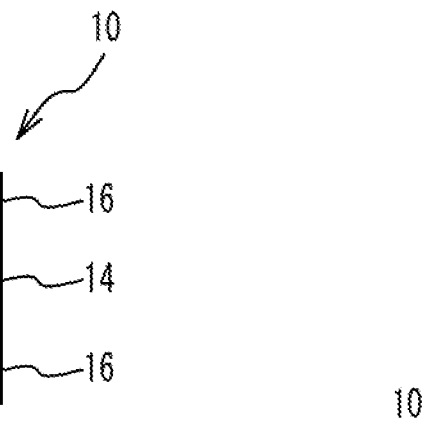
FIG. 5B and FIG. 5C are cross-sectional views illustrating another structure of the switch element in, accordance with the first embodiment.
Figure 5C:
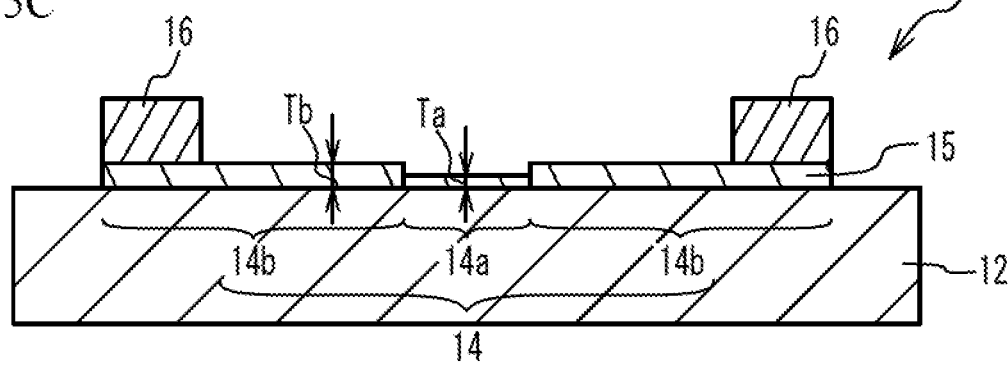

FIG. 5A illustrates another voltage-current characteristic of the switch element in accordance with the first embodiment, and FIG. 5B and FIG. 5C are cross-sectional views illustrating another structure of the switch element in accordance with the first embodiment. As illustrated in FIG. 5A, when the voltage V is 0 V the switch element is in the off state. When the voltage V is positive, the switch element is in the state at the voltage V equal to or greater than a voltage V3, and the switch element is in the off state at the voltage V equal to or less than the voltage V3. When the voltage V is negative, the switch element is in the on state at the voltage V equal to or less than a voltage −V3, and the switch element is in the off state at the voltage V equal to or greater than the voltage −V3. As seen above, the voltage-current characteristic may be a characteristic having little hysteresis.

As illustrated in FIG. 5B, the switch element 10 may have a structure in which the resistor 14 is located between the electrodes 16. As illustrated in FIG. 5C, the film thickness Ta of the active portion 14a of the resistor 14 may be less than the film thickness Tb of the extraction portion 14b. Other structures are the same as those of FIG. 1B.

The resistor 14 of the switch element 10 may be formed of, for example, zinc oxide (ZnO) or strontium titanate (SrTiO$_3$). The resistor 14 may be formed of a metallic insulator material such as vanadium oxide (VOx) as in Non-Patent Document 1 or a niobium oxide (NbOx) as in Non-Patent Document 2. The resistor 14 may be formed of a copper compound, chalcogenide, tungsten oxide, or amorphous oxide employed in Non-Patent Documents 3 through 6.

In the first embodiment, as illustrated in FIG. 1A, FIG. 1B, and FIG. 5B, the resistor 14 is connected between a pair of the electrodes 16 corresponding to a first end and a second end. As illustrated in FIG. 4A and FIG. 4B the resistor 14 between the electrodes 16 is in the off state when the RMS of the input voltage (a voltage applied to the first end with respect to the second end) within a predetermined time period (a first time period) is less than the threshold value Vth (a first threshold value), and the resistor 14 between the electrodes 16 is in the on state when the RMS is greater than. Vth (a second threshold value). Accordingly, the electronic circuit Laving a new function can be provided as described in a second and third embodiments.

The first threshold value and the second threshold value may be the same, or the second threshold value may be greater than the first threshold value. As illustrated in FIG. 2, the switch element 10 may have a hysteresis. When the switch element 10 has a hysteresis, the switching between the off state and the on state due to noise is inhibited.

The cycle period of variation in the input voltage Vin is shorter than the predetermined time period (the first time period). Accordingly, as illustrated in FIG. 4A and FIG. 4B, the off state and the on state are switched according to the RMS of the input voltage Vin. The period of the input voltage Vin is preferably equal to or less than one-half of the predetermined time period, and is more preferably equal to or less than one tenth of the predetermined time period.

The resistor 14 is in a metallic phase at a predetermined temperature (for example, the phase transition temperature) or greater, and is in an insulator phase at the predetermined temperature or less. This allows the resistor 14 to be in the off state when the RMS of the input voltage Vin is less than the threshold value Vth, and to be in the on state when the RMS is greater than Vth. When the off state and the on state are switched according to the temperature, the resistor 14 switches between the off state and the on state according to whether the RMS of the input voltage Vin is less or greater than the threshold value Vth. When the off state and the on state are switched according to the physical phenomenon other than the temperature like an ion conductor, the resistor 14 switches between the off state and the on state according to whether the average value of the input voltage Vin is less or greater than the threshold value Vth. Examples of the average value include an RMS, a simple average value, or a weighted average value. Which average value is to be used is determined by the physical phenomenon used to switch between the off state and the on state.

As illustrated in FIG. 1A and FIG. 1B, the thin film 15 formed of the resistor 14 is formed on the substrate 12. A pair of the electrodes 16 connects to the thin film 15. The thin film 15 of the resistor 14 has the active portion 14a and the extraction portions 14b. The width W of the active portion 14a is less than the width of the extraction portion 14b, and/or the film thickness Ta of the active portion 14a is less than the film thickness Tb of the extraction portion 14b as illustrated in FIG. 5C. This configuration causes the active portion 14a to efficiently generate heat. In addition, heat is efficiently dissipated from the active portion 14a through the substrate 12. Therefore, the first time period corresponding to the time constant of heat dissipation is able to be desirably set with use of the planar shape of the resistor 14 and the type or the thickness of the substrate 12. In the structure illustrated in FIG. 5B, the boundary interface between the electrode 16 and the resistor 14 may be applied with a high electric field, and thereby, may be damaged. In the structures illustrated in FIG. 1A, FIG. 1B, and FIG. 5C, since a voltage is mainly applied to the active portion 14a, the damage near the boundary interface between the electrode 16 and the resistor 14 is inhibited.

Second Embodiment

Figure 6:
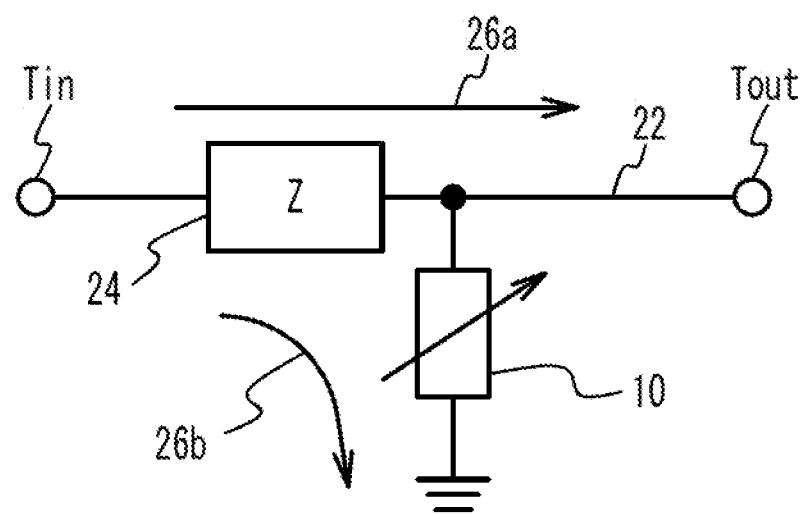
FIG. 6 is a circuit diagram of an alternate current limiting circuit in accordance with, a second embodiment.

A second embodiment describes an example where the switch element in accordance with the first embodiment is applied to an alternate current limiting circuit. FIG. 6 is a circuit diagram of an alternate current limiting circuit in accordance with the second embodiment. As illustrated in FIG. 6, a line 22 is located between an input terminal Tin and an output terminal Tout. In the line 22, an impedance element 24 is connected in series. The switch element 10 is shunt-connected to the line 22. That is, a first end of the switch element 10 is coupled to the line 22, and a second end of the switch element 10 is grounded. The input voltage Vin (i.e., the input signal) is input to the input terminal Tin. When the switch element 10 is in the off state, the input signal propagates through the line 22 as indicated by an arrow 26a, and is output from the output terminal Tout. When the switch element 10 is in the on state, the input signal is grounded through the switch element 10 as indicated by an arrow 26b. Thus, the input signal is not output from the output terminal Tout.

The input voltage Vin was configured to be a trigonometric function wave, the amplitude of the input voltage Vin was varied, and the output voltage Vout was measured. The impedance element 24 was configured to be a resistor with a resistance value of 107Ω, and the frequency of the input voltage Vin was set at 1 MHz.

Figure 7:
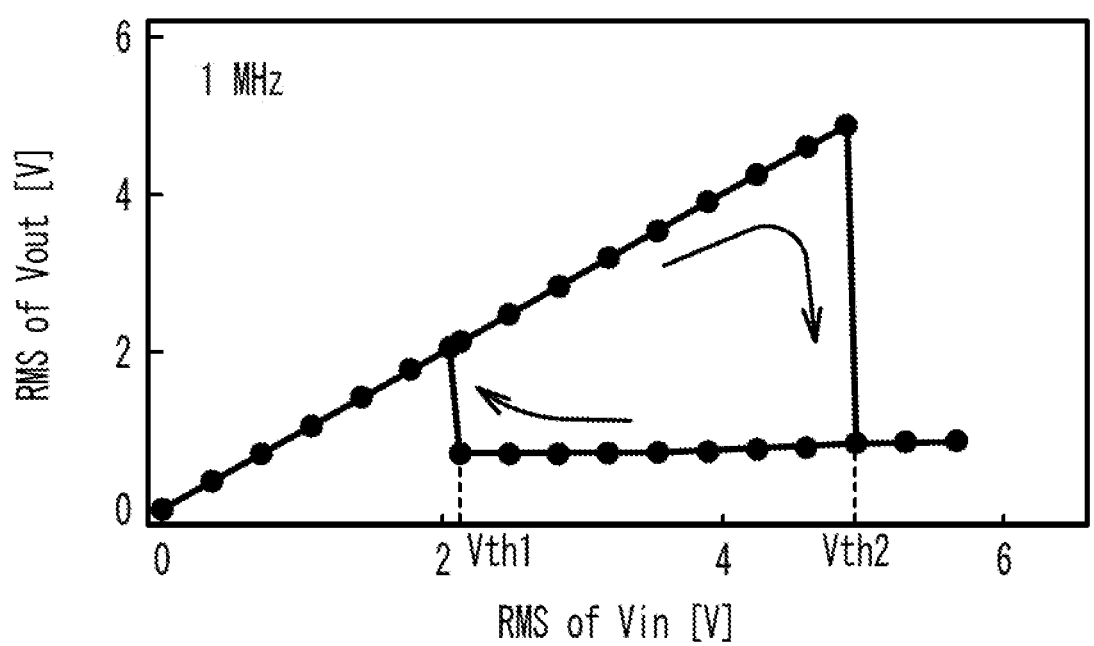
FIG. 7 illustrates measurement results of the alternate current limiting circuit in accordance with the second embodiment.

FIG. 7 illustrates measurement results of the alternate current limiting circuit in accordance with the second embodiment. The horizontal axis represents the RMS of the input voltage Vin, and the vertical axis represents the RMS of the output voltage Vout. As illustrated in FIG. 7, when the RMS of the input voltage Vin is 0 V, the switch element 10 is in the off state. While the switch element 10 is in the off state, as the RMS of the input voltage Vin increases from 0, the RMS of the output voltage Vout increases in proportion to the RMS of the input voltage Vin. In this case, the input signal passes through the line 22, and is output from the output terminal Tout. When the RMS of the input voltage Vin becomes equal to or greater than a threshold value Vth2, the switch element 10 goes into the on state. Accordingly, the input signal flows to a ground through the switch element 10. Therefore, the input signal is not output from the output terminal Tout, and the RMS of the output voltage Vout becomes small. When the RMS of the input voltage Vin is decreased and the RMS of the input voltage Vin becomes equal to or less than a threshold value Vth1, the switch element 10 goes into the off state. Thus, the RMS of the output voltage Vout decreases in proportion to the input voltage Vin. In this case, the input signal passes through the line 22, and is output from the output terminal Tout.

As seen above, the alternate current limiting circuit of the second embodiment outputs the input signal to the output terminal Tout when the RMS of the input voltage Vin is less than the threshold value Vth1 (i.e., the amplitude of the input signal is small). When the RMS of the input voltage Vin is greater than the threshold value Vth2 (i.e., the amplitude of the input signal is large), the input signal is not output to the output terminal Tout. For example, when the output terminal Tout is coupled to an internal circuit, a signal with a large electrical power is inhibited from being input to the internal circuit.

The alternate current limiting circuit can be made by using a varistor or a zener diode. However, the varistor and the zener diode switch between the on state and the off state according to the instant voltage. Thus, the waveform of the input voltage Vin is distorted, and is then output as the output voltage Vout. Thus, harmonics are generated. Accordingly, the linearity deteriorates.

On the other hand, in the second embodiment, the on state and the off state are switched according to the RMS of the input voltage Vin by using the switch element 10 of the first embodiment. Thus, the waveform of the input voltage Vin is not distorted. Therefore, the linearity of the output voltage Vout is improved. In addition, the cutoff frequency of the switch element 10 using vanadium oxide is 26.5 THz. Thus, the switch element 10 can be used as the limiting circuit for high-frequency signals. In addition, the threshold value Vth for the switch element 10 using vanadium oxide can be reduced by reducing the size of the active portion 14a. For example, the threshold value Vth for the switch element 10 can be set at 0.3 V, which is an order of magnitude less than those for the varistor and the zener diode.

In the second embodiment, as illustrated in FIG. 6, the limiting circuit has the line 22 that transmits an alternate current signal, and the switch element 10 of the first embodiment shunt-connected to the line 22. This structure improves the linearity of the output voltage. In addition, the threshold value Vth2 is greater than Vth1. This configuration inhibits the on state and the off state from being switched by noise.

The period of the input voltage Vin (i.e., the period of the alternate current signal) is less than the predetermined time period corresponding to the time constant of heat dissipation of the switch element 10. This configuration allows the alternate current limiting circuit to limit the alternate current signal when the amplitude of the alternate current signal is large. The period of the alternate current signal is preferably equal to or less than one-half of the predetermined time period, more preferably equal to or less than one tenth of the predetermined time period.

Third Embodiment

Figure 8:
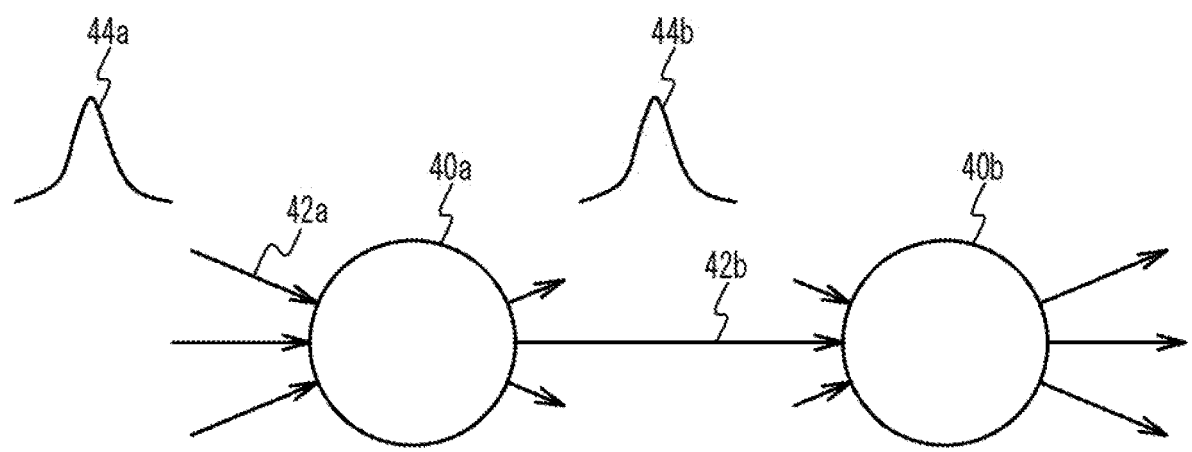
FIG. 8 is a schematic view illustrating a neuron network.

A third embodiment describes an example in which the switch element in accordance with the first embodiment is applied to a neuron circuit. First, a neuron network in which a neuron circuit is used will be described. FIG. 8 is a schematic view illustrating the neuron network. As illustrated in FIG. 8, neurons 40a and 40b of the neuron network will be described. Spike signals 44a are input to the neuron 40a from a plurality of synapses 42a. When the neuron 40a fires, spike signals 44b are output to a plurality of synapses 42b. One of the synapses 42b is input to the neuron 40b. As described, the neurons 40a and 40b and the synapses 42a and 42b form the neuron network.

Figure 9:
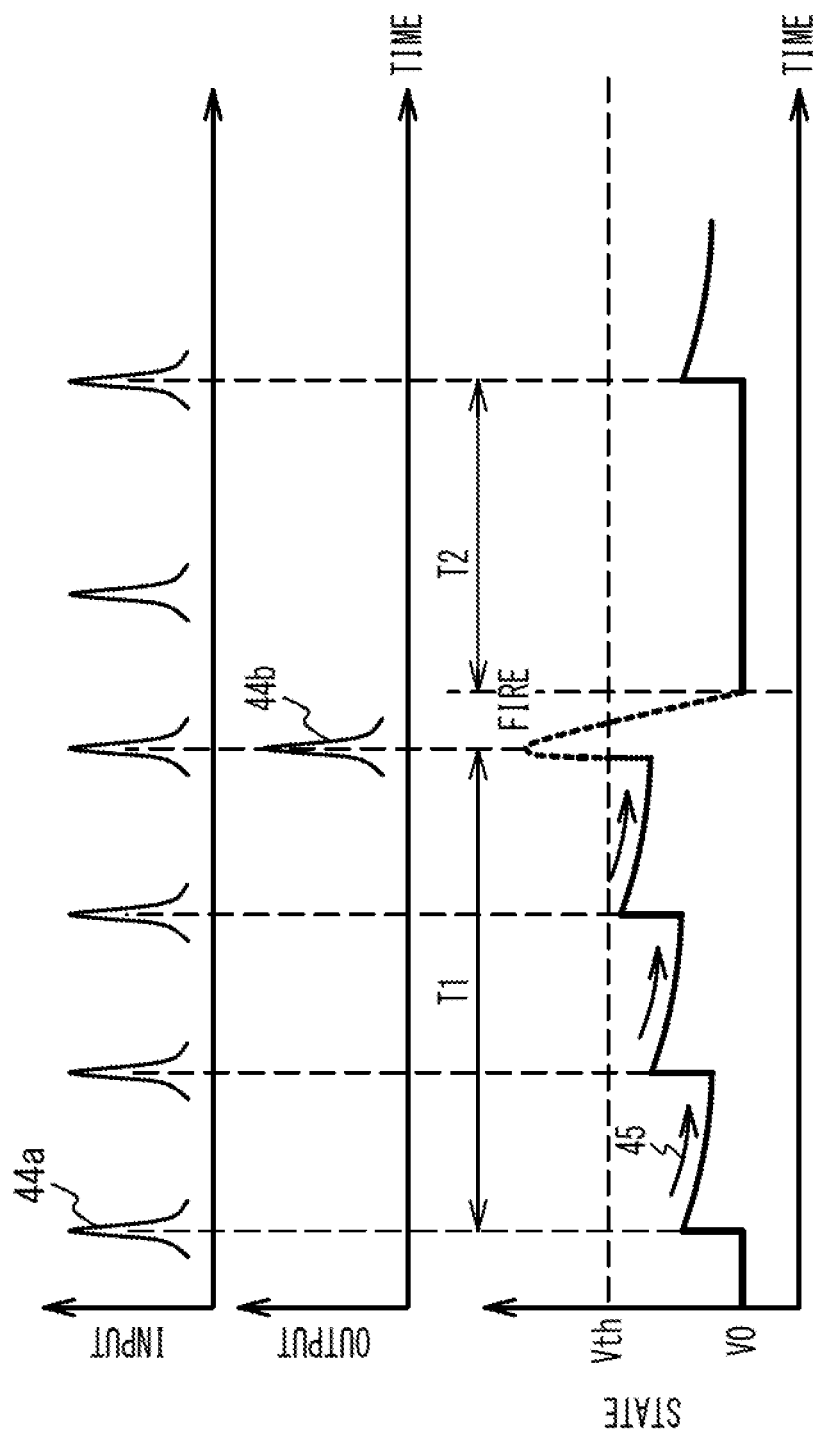
FIG. 9 is a timing chart illustrating the operation of a neuron.

FIG. 9 is a timing chart illustrating the operation of the neuron. Illustrated are the input from the synapse 42a to the neuron 40a, the output from the neuron 40a to the synapse 42b, and the state (for example, the electric potential) of the neuron 40a with respect to time. As illustrated in FIG. 9, during the leaky-integrate period T1, the spike signal 44a is input to the neuron 40a from one or more synapses 42a. Every time the spike signal 44a is input, the state of the neuron 40a rises. The state of the neuron 40a returns to the original state V0 with a certain time constant as indicated by an arrow 45. When the spike signals 44a are continuously input, the state of the neuron 40a becomes higher. When the state of the neuron 40a reaches the threshold value Vth, the neuron 40a fires, and outputs the spike signal 44b to the synapse 42b. The neuron 40a returns to its original state V0. Thereafter, a refractory period T2 during which no response is output even when the spike signal 44a is input is established, and the leaky-integrate period is then established again.

Figure 10:
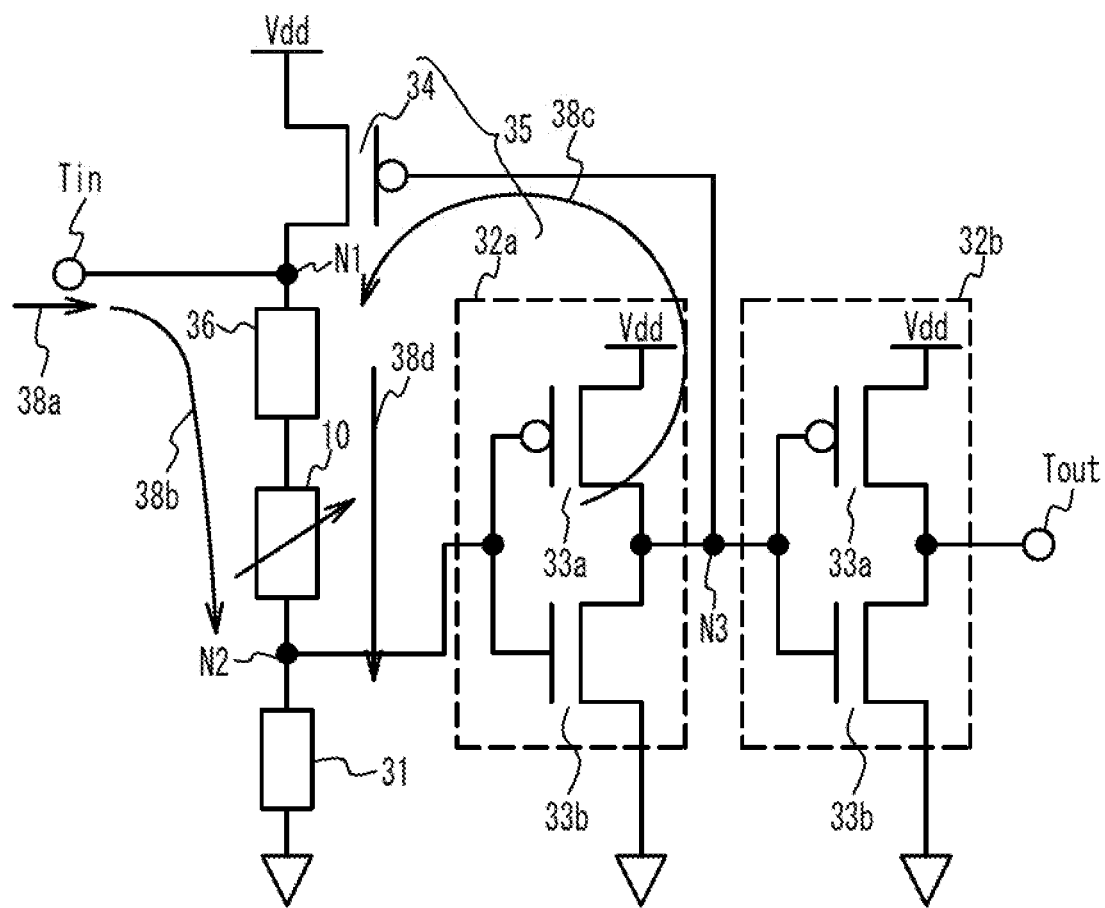
FIG. 10 is a circuit diagram of a neuron circuit in accordance with a third embodiment.

Next, the neuron circuit that operates as the neuron 40a will be described. FIG. 10 is a circuit diagram of a neuron circuit in accordance with the third embodiment. The input terminal Tin is coupled to a node N1. A switch element 36, the switch element 10 of the first embodiment, and a load resistor 31 are connected in series between the node N1 and a ground (reference potential). A node N2 between the switch element 10 and the load resistor 31 is coupled to the output terminal Tout through inverter circuits 32a and 32b. Each of the inverter circuits 32a and 32b has a PFET (field effect transistor) 33a and an NFET 33b. A node N3 between the inverter circuits 32a and 32b is coupled to the gate of a PFET 34. The source of the FET 34 is coupled to the power source of the voltage Vdd, and the drain of the FET 34 is coupled to the node N1. A feedback circuit 35 includes the inverter circuit 32a and the FET 34. The switch element 36 turns on when the voltage applied to both ends is low, and turns off when the voltage applied to both ends is high.

Figure 11:
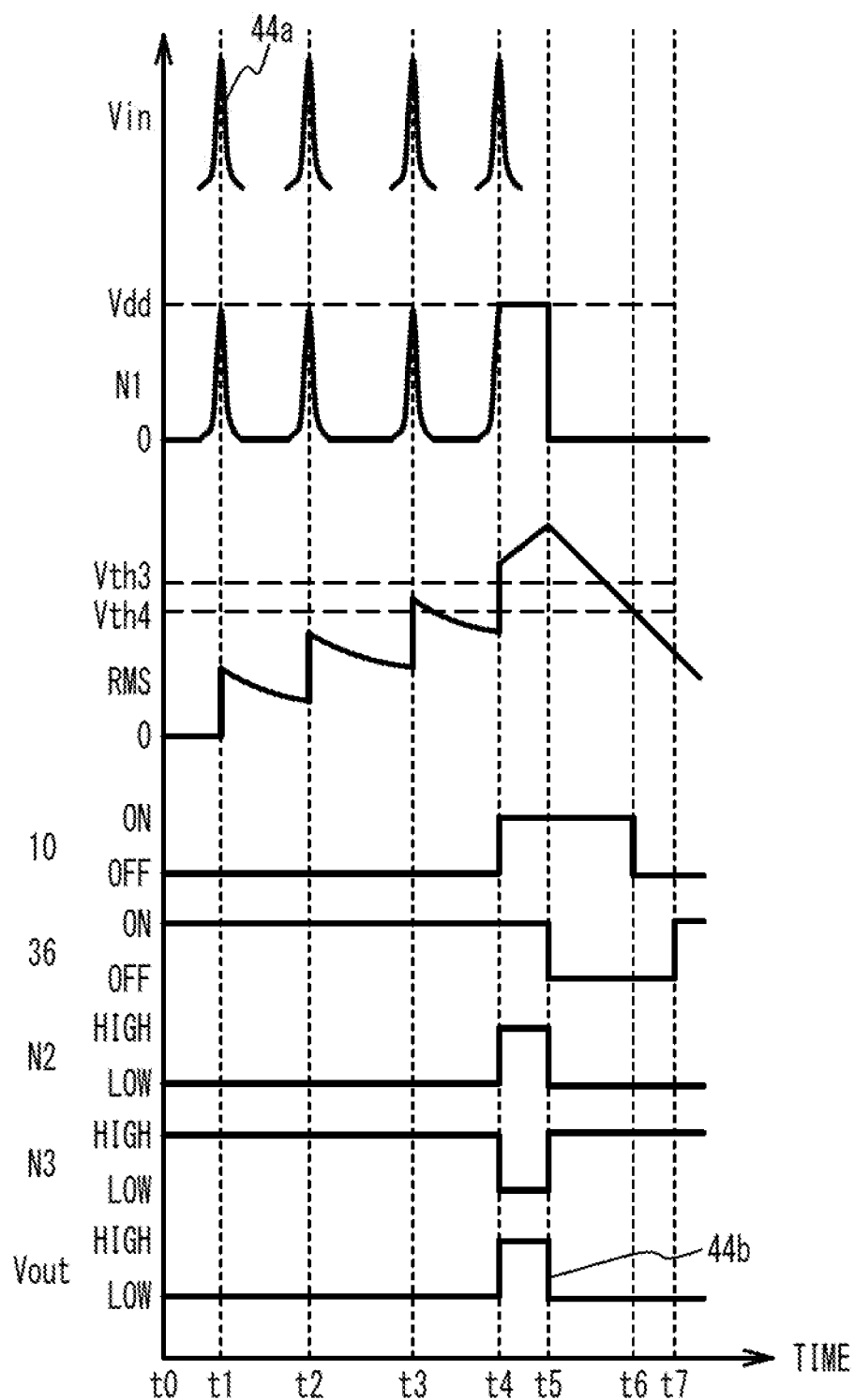
FIG. 11 is a timing chart of the neuron circuit in the third embodiment.

FIG. 11 is a timing chart of the neuron circuit in the third embodiment. Illustrated are variations over time in the input voltage Vin input to the input terminal Tin, the voltage of the node N1, the RMS of the voltage applied to the switch element 10, the state of the switch element 10, the state of the switch element 36, the voltage of the node N2, the voltage of the node N3, and the output voltage Vout. The interval from time t4 to t7 is illustrated so as to make the description easier, and does not reflect the actual length of time.

As illustrated in FIG. 11, at time t0, the input voltage Vin is 0, and the spike signal 44a is not input. The voltage of the node N1 is 0 V (or the voltage close to a low level). Thus, almost no voltage is applied to both ends of each of the switch elements 10 and 36. Therefore, the switch element 10 is in the off state, and the switch element 36 is in the on state. In addition, since the node N2 is at a low level, the node N3 is at a high level, and the output voltage Vout is at a low level. Since the node N3 is at a high level, the PFET 34 turns off, and the voltage Vdd is not applied to the node N1.

At time t1, the spike signal 44a is input (an arrow 38a in FIG. 10). The voltage of the node N1 is a voltage of (0 V+the voltage of the spike signal 44a). Even when a single spike signal 44a is applied to the switch element 10, the RMS within the predetermined time period does not exceed a threshold value Vth3. Thus, the switch element 10 is in the off state. The switch element 36 remains in the on state even when the spike signal 44a is applied. Since the switch element 10 is in the off state, the voltages of the nodes N2 and N3 and the output voltage Vout do not change. When the spike signal 44a is input at time t2 and time t3, the RMS of the switch element 10 rises (an arrow 38b of FIG. 10, leaky integrate), but does not exceed the threshold value Vth3.

Thus, the voltage of the nodes N2 and N3 and the output voltage Vout do not change. The height of the spike signal 44a may differ from the voltage Vdd.

When the spike signal 44a is input at time t4, the RMS of the switch element 10 within the predetermined time exceeds the threshold value Vth3. At the same time, the switch element 10 goes into the on state. Since both the switch element 10 and the switch element 36 are in the on state, the level of the voltage of the node N2 becomes a high level for an instant. Accordingly, the level of the voltage of the node N3 becomes a low level for an instant. Since the node N3 is at a low level, the FET 34 turns on. Accordingly, the voltage of the node N1 becomes Vdd (an arrow 38c, firing). Since the partial voltage of the voltage Vdd is applied to the switch element 10, the switch element 10 remains in the on state. Thus, the node N2 remains at a high level, the node N3 remains at a low level, and the level of the output voltage Vout remains a high level.

At this time, a partial voltage of the voltage Vdd is applied to the switch element 36. This causes the switch element 36 to go into the off state at time t5 immediately thereafter. When the switch element 36 goes into the off state, the level of the voltage of the node N2 becomes a low level. Thus, the level of the voltage of the node N3 returns to a high level, and the level of the output voltage Vout returns to a low level. When the interval between time t4 and time t5 is short, the output voltage Vout outputs the spike signal 44b. The height of the spike signal 44b is desirably set with use of the power source voltage of the inverter circuit 32b.

Since the node N3 becomes at high level, the FET 34 turns off. The voltage of the node N1 returns to 0 V. After time t5, the RMS of the switch element 10 decreases, and the switch element 10 goes into the off state (an arrow 38d, reset) at time t6 when the RMS becomes equal to or less than a threshold value Vth4. At time t7, the switch element 36 is back in the on state. The period between time t5 and t7 is a refractory period during which no response is output even when the spike signal 44a is input. Times t6 and t7 may be reversed. When the switch element 10 has no hysteresis, the threshold values Vth3 and Vth4 are approximately the same. When the switch element 10 has hysteresis, the threshold value Vth4 is less than Vth3.

It is sufficient if the switch element 36 is in the on state when an applied voltage is low, and is in the off state when an applied voltage is high. As with the switch element 10, the switch element 36 may switch between the on state and the off state according to the RMS of the voltage between both ends within a predetermined time period longer than the time for the voltage of the spike signal 44a to change. In this case, as the predetermined time period increases, the refractory period increases. The switch element 36 may switch between the on state and the off state at a time interval shorter than the time for the voltage of the spike signal 44a to change.

For example, an Esaki diode or a Gunn diode may be used as the switch element 36. In this case, since the relaxation time is approximately 0, there is almost no refractory period.

The switch element 36 may be a trap element using a metallic oxide as in Non-Patent Document 7, an organic substance as in Non-Patent Document 8, or a semiconductor as in Non-Patent Document 9. The switch element 36 may be a unipolar resistance switch element using chalcogenide as in Non-Patent Document 10, or a metallic oxide as in Non-Patent Document 11. In the case of the unipolar resistance switch element, when the spike signal is input to the input voltage Vin after time t6, the switch element 36 is back in the on state.

In the third embodiment, as illustrated in FIG. 10 and FIG. 11, the spike signal 44a is input to the input terminal Tin. The switch element 10 (a first switch element) is the switch element of the first embodiment, and has a first end coupled to the input terminal Tin through the switch element 36 and a second end coupled to the output terminal Tout through the feedback circuit 35. The switch element 10 remains in the off state even when a single spike signal 44a is input, and goes into the on state when a plurality of the spike signals 44a are input within the predetermined time period (a second time period). The output terminal Tout outputs a high level when the switch element 10 goes into the on state. As seen above, the switch element 10 of the first embodiment may be used as an element that conducts leaky integrate and fire of the neuron circuit. The switch element 10 goes into the off state when no voltage is applied. Thus, the reset after firing is automatically conducted.

The feedback circuit 35 is coupled to the second end of the switch element 10, and causes the input terminal Tin (the node N1) to be at a high level when the switch element 10 goes into the on state. The switch element 36 is connected in series with the switch element 10 between the input terminal Tin and the input of the feedback circuit 35. The switch element 36 remains in the on state even when one or more spike signals 44a are input to the input terminal Tin, and goes into the off state when the input terminal Tin becomes at a high level. The output terminal Tout outputs a high level when both the switch elements 10 and 36 are in the on state, and outputs a low level when at least one of the switch elements 10 and 36 is in the off state. Since the node N1 becomes at a high level at time t4, the firing is more reliably conducted. The switch element 36 is able to cause the switch element 10 in the on state to go into the off state.

As in the second and third embodiments, the switch element 10 of the first embodiment can be applied to various electronic circuits.

Fourth Embodiment

Figure 12:
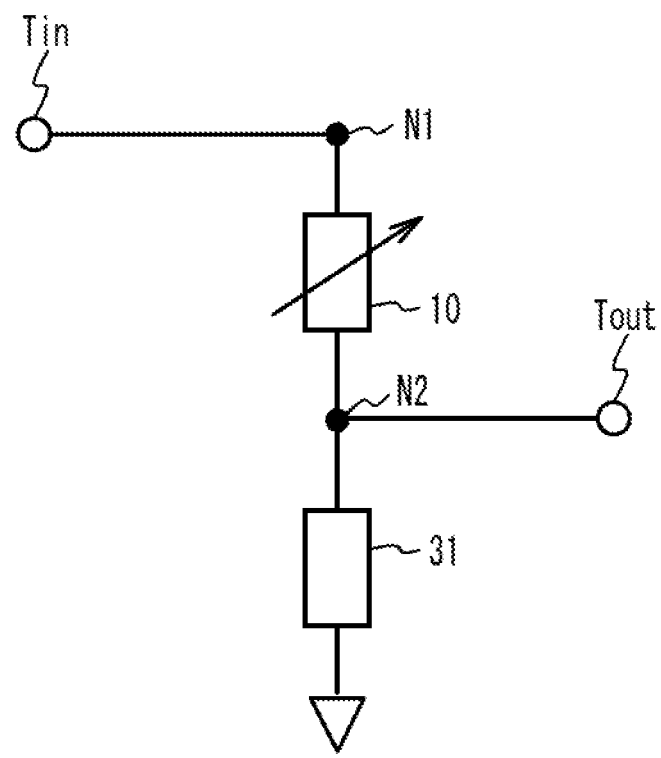
FIG. 12 is a circuit diagram of a switch circuit in accordance with a fourth embodiment.

A fourth embodiment is an exemplary switch circuit. FIG. 12 is a circuit diagram of a switch circuit in accordance with the fourth embodiment. As illustrated in FIG. 12, the switch element 10 and the load resistor 31 are connected in series between the input terminal Tin and a ground (a reference potential terminal). The output terminal Tout is coupled to the node N2 between the switch element 10 and the load resistor 31. The switch element 10 is the switch element in accordance with the first embodiment. Other structures are the same as those of the third embodiment, and the description thereof is thus omitted.

When generalized, the internal state quantity S10 of the switch element 10 is expressed by equation 1.

$$S(T_0) = \int_0^{T_0} f(V_{10}(T_0-T))e^{-T/\tau_{dec}} dT \quad \text{[Equation 1]}$$

Here, $S(T_0)$ represents the internal state quantity S10 at time $T_0$, $V_{10}$ represents the voltage between both ends of the switch element 10, $f(V_{10})$ represents the effect of $V_{10}$ on the internal state quantity S10, and $\tau_{dec}$ represents the relaxation time of the internal state quantity S10 (the time for the difference from the equilibrium value to be 1/e).

The internal state quantity S10 corresponds to, for example, the average value of the voltage $V_{10}$ within the predetermined time period. The resistor 14 of the switch element 10 goes into the on state (i.e., the low resistance state) when the internal state quantity S10 becomes greater than a threshold value $S_{th}$, and goes into the off state (i.e., the high resistance state) when the internal state quantity S10 becomes less than the threshold value $S_{th}'$. The resistance value of the low resistance state is represented by RL, the resistance value of the high resistance state is represented by RH, and RH>RL.

When the on-off mechanism of the switch element 10 is the temperature phase transition of the resistor 14, the internal state quantity S10 corresponds to the local temperature of the resistor 14. The effect $f(V_{10})$ of the voltage $V_{10}$ on the internal state quantity S10 corresponds to joule heat. The effect $f(V_{10})$ is expressed by $f(V_{10})=A \times V_{10}^2$ where A represents a proportionality constant. For example, when $C_H$ represents the specific heat of the resistor 14 and the neighboring part of the resistor 14, and R14 represents the resistance value of the resistor 14, $A=1/(C_H \times R14)$. The resistance value R14 is the resistance value of the on state when the resistor 14 is in the on state, and is the resistance value of the off state when the resistor 14 is in the off state. In addition, when $\exp(-T/\tau_{dec})$ is approximated by a function that has 1 at time T from 0 to $\tau_{dec}$ and has 0 at time T after $\tau_{dec}$, $S(T_0)$ is the RMS of $V_{10}$ in the period $\tau_{dec}$.

When the on-off mechanism of the switch element 10 is built by forming an electrochemical filament, the internal state quantity S10 corresponds to an ion concentration. The effect $f(V_{10})$ of the voltage $V_{10}$ on the internal state quantity S10 corresponds to an amount of ion formation. For example, i0 represents the exchange current density of a targeted ion formation reaction, $V_{eg}$ represents an equilibrium potential, e represents an elementary charge, k represents Boltzmann's constant, and T represents an absolute temperature, $f(V_{10})=i0 \times \exp[e(V_{10}-V_{eg})/2kT]$.

When the on-off mechanism of the switch element 10 is built by dielectric breakdown, the internal state quantity S10 corresponds to a defect concentration. The effect $f(V_{10})$ of the voltage $V_{10}$ on the internal state quantity S10 corresponds to a current. For example, when A0 represents Richardson's constant and Vth represents the barrier height inside the switch element 10, $f(V_{10})=A0 \times T^2 \times \exp[e(V_{10}-V_{th})/kT]$.

Figure 13:
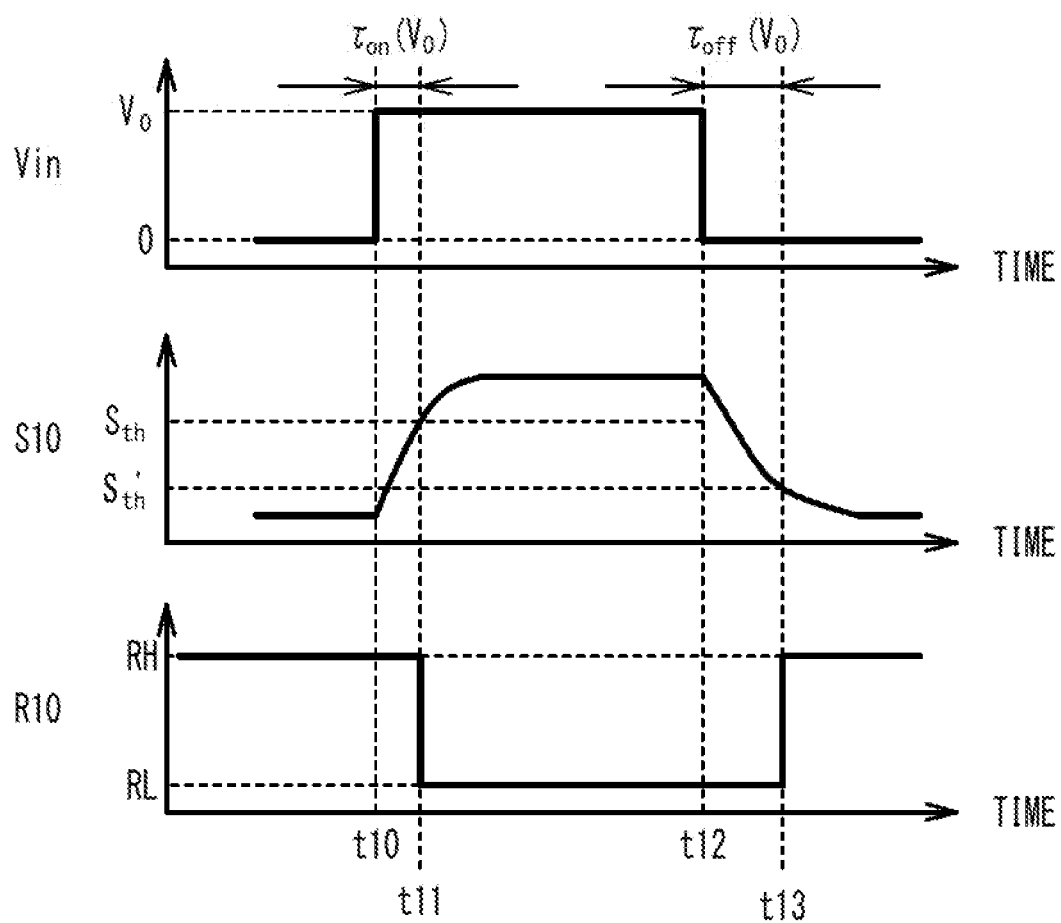
FIG. 13 is a timing chart of a switch element 10 in the fourth embodiment.

FIG. 13 is a timing chart of the switch element 10 in the fourth embodiment. Illustrated are variations over time in the input voltage Vin of the input signal, the internal state quantity S10 of the switch element 10, and the resistance value R10 between both ends of the switch element 10. Assumed is a case where a stepwise voltage $V_0$ is applied to the input terminal Tin.

As illustrated in FIG. 13, the input voltage Vin is 0 V, the internal state quantity S10 is 0, and the resistance value R10 is the high resistance RH (i.e., the off state). At time t10, the input voltage Vin becomes $V_0$. From time t10, the internal state quantity S10 increases, and when the internal state quantity S10 becomes equal to or greater than the threshold value $S_{th}$ at time t11, the resistance value R10 becomes a low resistance (i.e., the on state). The period from time t10 to t11 is the period $\tau_{on}(V_0)$ required to turn on.

When the input voltage Vin becomes 0 V at time t12, the internal state quantity S10 starts decreasing. When the internal state quantity S10 becomes equal to or less than the threshold value $S_{th}'$ at time t13, the resistance value R10 becomes a high resistance. The period from time t12 to t13 is the period $\tau_{off}(V_0)$ required to turn off.

The periods $\tau_{on}(V_0)$ and $\tau_{off}(V_0)$ are respectively expressed by equations 2 and 3 with use of $S_m(V_0)$ representing the internal state quantity S10 and the relaxation time $\tau_{dec}$.

$$\tau_{on}(V_0) = \tau_{dec} \log\left(\frac{S_m(V_0)}{S_m(V_0) - S_{th}}\right) \quad \text{[Equation 2]}$$

$$\tau_{off}(V_0) = \tau_{dec} \log\left(\frac{S_m(V_0)}{S_{th}'}\right) \quad \text{[Equation 3]}$$

Figure 14:
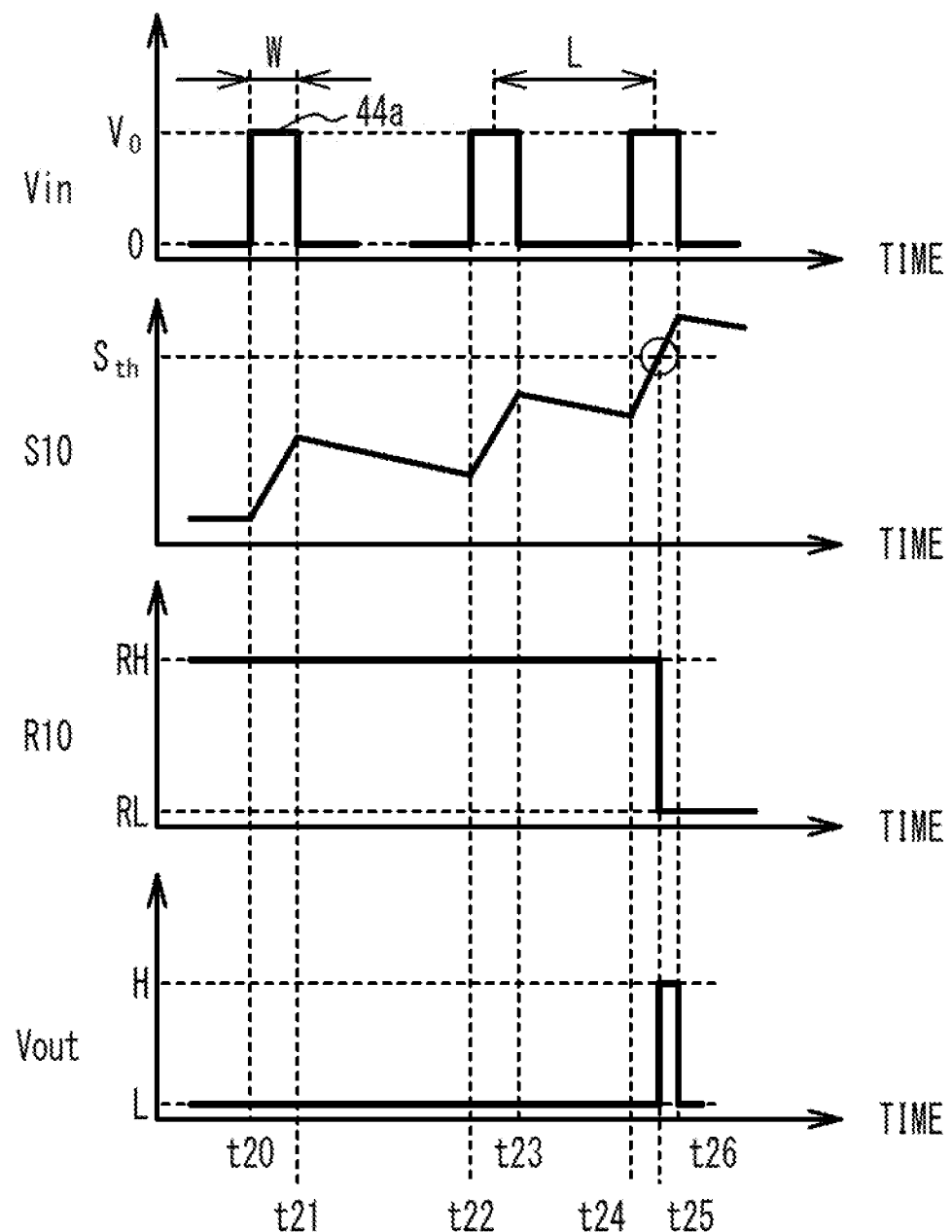
FIG. 14 is a timing chart of a switch circuit in the fourth embodiment.

FIG. 14 is a timing chart of a switch circuit in the fourth embodiment. Illustrated are the input voltage Vin of the input signal, the internal state quantity S10 of the switch element 10, the resistance value R10 of the switch element 10, and the output voltage Vout of the output signal. A plurality of spike signals 44a are continuously input to the input terminal Tin.

As illustrated in FIG. 14, when the input voltage Vin is 0 and the switch element 10 has the high resistance RH, the voltage of the node N1 is 0 V and the level of the output voltage Vout is a low level (0 V). The spike signal 44a is input at time t20, t22, and t24, and the input of the spike signal finishes at time t21, t23, and t26. The width of the spike signal 44a is W. The minimum interval of the spike signals 44a is L.

At time t20, t22, and t24, the internal state quantity S10 starts increasing, and at time t21, t23, and t26, the internal state quantity S10 starts decreasing. The decrease rate of the internal state quantity S10 is less than the increase rate of the internal state quantity S10. When the spike signal 44a is input at t22 and t24 before the internal state quantity S10 becomes 0, the internal state quantity S10 is accumulated. When the internal state quantity S10 becomes equal to or greater than the threshold value $S_{th}$ at time t25, the resistance value R10 becomes the low resistance RL. The voltage of the node N2 becomes approximately $V_0$. Thus, the level of the output voltage Vout becomes a high level. When the input voltage Vin becomes 0 V at time t26, the output voltage Vout becomes 0 V.

Since the high level and the low level of the output terminal Tout are switched according to the change in resistance of the switch element 10, when the resistance value of the load resistor 31 is represented by R31, RH>R31>RL is preferable.

The width W of the spike signal 44a is preferably shorter than $\tau_{on}(V_0)$ to prevent the switch element 10 from going into the on state by a single spike signal 44a.

The interval L of the spike signals 44a is preferably shorter than the relaxation time $\tau_{dec}$ so that the internal state quantity S10 does not return and the internal state quantity S10 is accumulated when the next spike signal 44a is input.

In the fourth embodiment, a first end of the switch element 10 is coupled to the input terminal Tin, and a second end of the switch element 10 is coupled to the output terminal Tout. The resistor 14 of the switch element 10 is in the high resistance state when the internal state quantity S10, expressed by equation 1, is less than the threshold value $S_{th}'$ (a first threshold value), and is in the low resistance state of which the resistance value is lower than that of the high resistance state when the internal state quantity S10 is greater than the threshold value $S_{th}$ (a second threshold value).

Accordingly, achieved is the switch circuit that switches the output signal on the basis of the internal state quantity S10 in which the input voltage Vin is accumulated. The input voltage Vin may not be necessarily the spike signal 44a as in FIG. 4A and FIG. 4B. The cycle period of variation in the input voltage Vin is preferably shorter than the relaxation time $\tau_{dec}$ of the internal state quantity S10 so that the internal state quantity S10 is accumulated.

As illustrated in FIG. 14, when a plurality of spike signals 44a are continuously input, as the input voltage Vin, to the input terminal Tin, the interval L of the spike signals 44a is preferably shorter than the relaxation time $\tau_{dec}$. This configuration allows the internal state quantity to accumulate the spike signal 44a.

Fifth Embodiment

Figure 15:
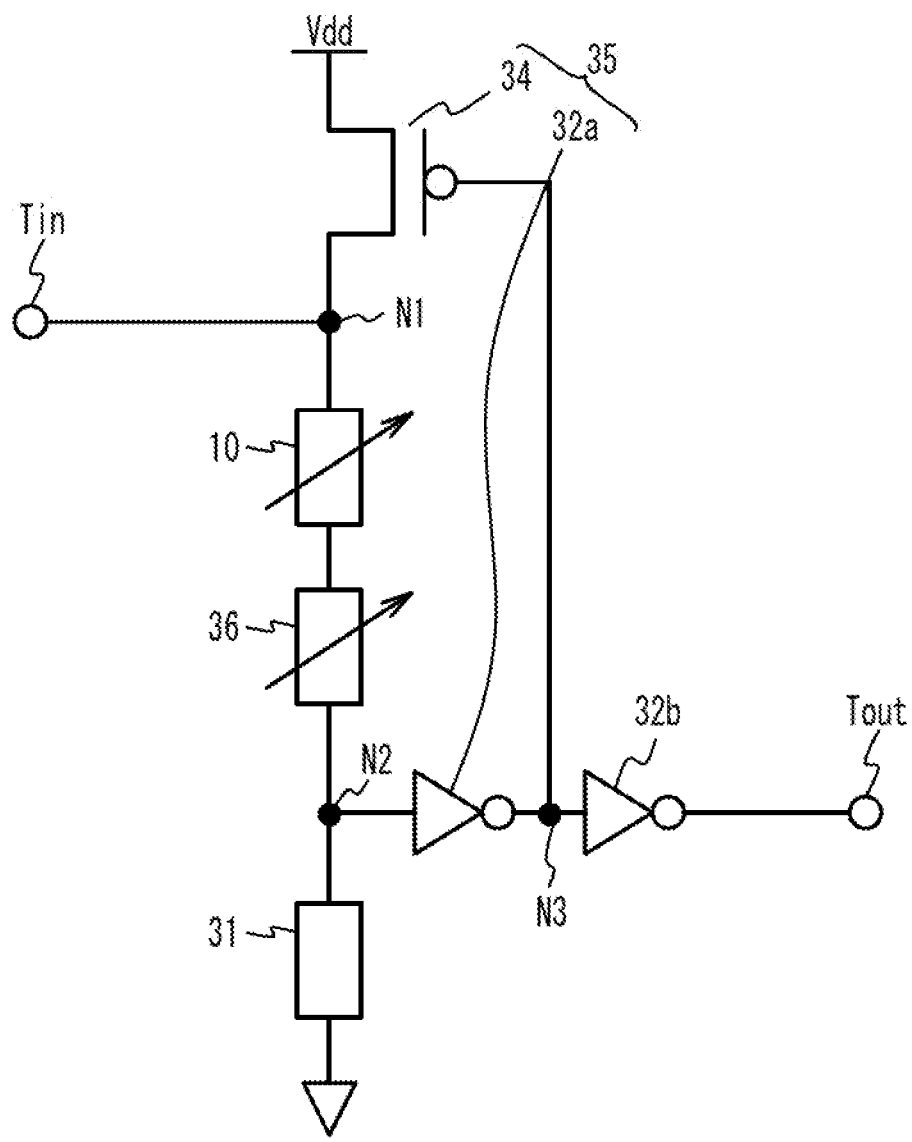
FIG. 15 is a circuit diagram of a neuron circuit in accordance with a fifth embodiment.

A fifth embodiment is an example in which the switch circuit of the fourth embodiment is applied to a neuron circuit. FIG. 15 is a circuit diagram of a neuron circuit in accordance with the fifth embodiment. As illustrated in FIG. 15, the structure is the same as the structure illustrated in FIG. 10 except that the connection of the switch element 10 and the switch element 36 is opposite to that of the third embodiment illustrated in FIG. 10, and the description thereof is thus omitted.

Figure 16:
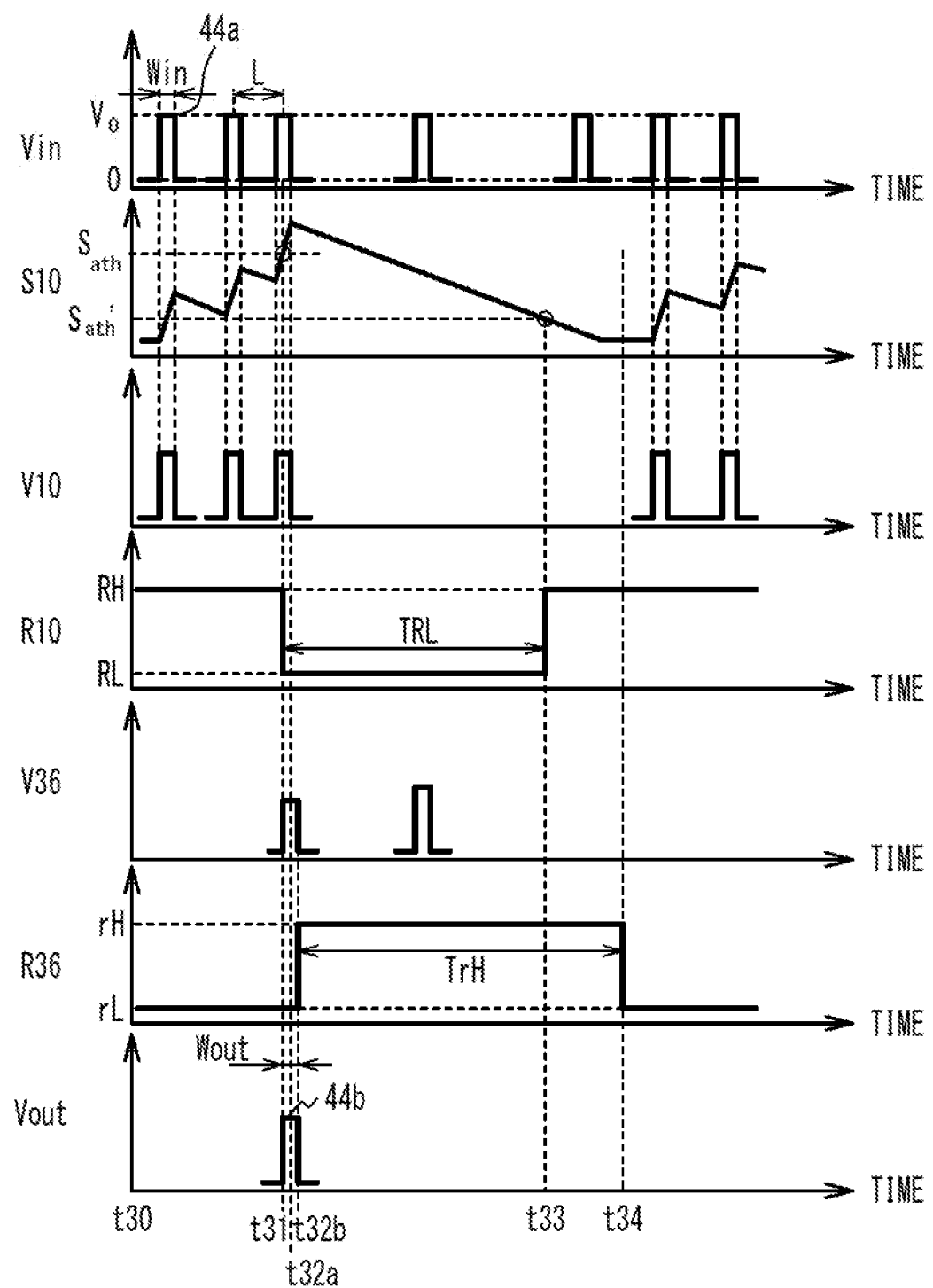
FIG. 16 is a timing chart of the neuron circuit in the fifth embodiment.

FIG. 16 is a timing chart of the neuron circuit in the fifth embodiment. Illustrated are variations over time in the input voltage Vin, the internal state quantity S10 of the switch element 10, the voltage V10 and the resistance value R10 between both ends, the voltage V36 and the resistance value R36 between both ends of the switch element 36, and the output voltage Vout.

As illustrated in FIG. 16, at time t30, the resistance value R10 of the switch element 10 is the high resistance RH, and the resistance value of the switch element 36 is a low resistance rL. A plurality of spike signals 44a are input as the input voltage Vin. The width of the spike signal 44a is Win, and the interval of the spike signals 44a is L.

During the period from time t30 to t31, the switch element 10 has the high resistance RH, and the switch element 36 has the low resistance rL. Thus, the input voltage Vin is mainly applied to the switch element 10, and is hardly applied to the switch element 36. The internal state quantity S10 of the switch element 10 increases every time the spike signal 44a is input.

When the internal state quantity S10 becomes greater than a threshold value $S_{ath}$ at time t31, the resistance value of the switch element 10 becomes the low resistance RL. Since both the switch elements 10 and 36 have a low resistance, the node N2 becomes at a high level, and the node N3 becomes at a low level. The FET 34 turns on, and the node N1 becomes at a high level. When RL and rL are approximately the same, the high level is divided to the switch elements 10 and 36. Thus, the voltage V36 of the switch element 36 becomes large. Even when the input signal Vin becomes 0 V at time t32a, the switch element 36 has the low resistance rL. At time t32b, the resistance value of the switch element 36 becomes a high resistance rH. The node N2 becomes at a low level. Between time t31 and t32b, the spike signal 44b with a width of Wout is output as the output voltage Vout.

At time t32b, the resistance value of the switch element 10 becomes the low resistance RL and the resistance value of the switch element 36 becomes the high resistance rH. Thus, the voltage of the input voltage Vin is mainly applied to the switch element 36, and is hardly applied to the switch element 10. Thus, even when the spike signal 44a is input, the internal state quantity S10 of the switch element 10 continues to decrease.

When the internal state quantity S10 of the switch element 10 becomes less than a threshold value $S_{ath}'$ at time t33, the resistance value of the switch element 10 becomes the high resistance RH. At time t34, the resistance value of the switch element 36 becomes the low resistance rL. The variations after time t34 are the same as those after time t30.

In the period TRL between time t31 and t33, the switch element 10 is in the low resistance state. When it is assumed that the voltage $V_0$ of the spike signal 44a is not applied to the switch element 10 during the period TRL, the period TRL is $\tau_{dec} \times \log(S_{ath}/S_{ath}')$.

In the period TrH between time t32b and t34, the switch element 36 is in the high resistance state. The switch element 36 may have an internal state quantity S36 as with the switch element 10. The relaxation time of the internal state quantity S36 of the switch element 36 is $t_{dec}$. When the internal state quantity S36 of the switch element 36 becomes greater than $S_{bth}$, the resistance value of the switch element 36 becomes the high resistance rH, and when the internal state quantity of the switch element 36 becomes less than $S_{bth}'$, the resistance value of the switch element 36 becomes the low resistance rL. The resistance value of the switch element 36 becomes the low resistance rL after $t_{dec} \times \log(S_{bth}/S_{bth}')$ has elapsed since the last application of the voltage $V_0$ of the spike signal 44a.

Since the high level and the low level of the output terminal Tout are switched according to the change in resistances of the switch elements 10 and 36, when the resistance value of the load resistor 31 is represented by R31, RH, rH>R31>RL, rL is preferable.

As in the fourth embodiment, the width Win of the spike signal 44a is preferably shorter than $\tau_{on}$ ($V_0$). In addition, the interval L of the spike signals 44a is preferably shorter than the relaxation time $\tau_{dec}$.

To configure the width Win of the spike signal 44a of the input voltage Vin to be approximately equal to the width Wout of the spike signal 44b of the output voltage Vout, Wout is preferably practically $t_{on}(V_0)$. Here, $t_{on}(V_0)$ is the time for the resistance value of the switch element 36 to be the high resistance when the voltage of the voltage $V_0$ is applied to the switch element 36.

When the resistance value of the switch element 36 becomes the low resistance rL before the resistance value of the switch element 10 becomes the high resistance RH, the internal state quantity S10 of the switch element 10 responds to the spike signal 44a. Thus, the resistance value of the switch element 10 preferably becomes the high resistance RH before the resistance value of the switch element 36 becomes the low resistance rL. Thus, the period TrH during which the switch element 36 is in the high resistance state is preferably longer than the period TRL during which the switch element 10 is in the low resistance state.

To make the period TrH longer than the period TRL even when the spike signal 44a is never input during the period TrH, $\tau_{dec} \times \log(S_{ath}/S_{ath}') < t_{dec} \times \log(S_{bth}/S_{bth}')$ is preferable.

When a plurality of spike signals 44a are input during the period TRL, the interval L of the spike signals $44a < t_{dec} \times \log(S_{bth}/S_{bth}')$ is preferable to prevent the switch element 36 from being reset during the period TRL.

In the third embodiment and the fifth embodiment, the switch element 10 (a first switch element) has a first end coupled to the input terminal Tin and a second end coupled to the node N2 (an intermediate node). The switch element 10 remains in the high resistance state even when a single spike signal 44a is input, and goes into the low resistance state when a plurality of spike signals 44a are input within a first time period.

The feedback circuit 35 is coupled to the node N2, and causes the input terminal Tin to be at a high level (a predetermined level) when the switch element 10 goes into the low resistance state. The switch element 36 (a second switch element) is in the low resistance state as an initial state, and when the input terminal Tin becomes at a predetermined level (a high level) while the switch element 10 is in the low resistance state, goes into the high resistance state after the time corresponding to the width Wout of the spike signal 44b has elapsed.

Accordingly, the switch element 36 can cause the switch element 10 in the low resistance state to go into the high resistance state.

The load resistor 31 is preferably connected between the node N2 and the reference potential terminal. This configuration allows the intermediate node N2 to be at a high level or a low level.

The feedback circuit 35 may set the input terminal Tin at a predetermined level other than a high level at time t33, but preferably sets the input terminal Tin at a high level. This configuration ensures the firing.

As in the first embodiment, it is preferable that the resistor 14 of the switch element 10 is in the high resistance state when the internal state quantity S10, which is the average of the voltage applied to the first end with respect to the second end, is less than the threshold value $S_{ath}'$, and is in the low resistance state when the internal state quantity S10 is greater than the threshold value $S_{ath}$. As in the fourth embodiment, the internal state quantity S10 of the switch element 10 is preferably expressed by equation 1. This configuration allows the switch element 10 to remain in the high resistance state even when a single spike signal 44a is input, and to go into the low resistance state when a plurality of spike signals 44a are input within the first time period.

When the resistor 14 of the switch element 10 is in a metallic phase at a predetermined temperature or greater, and is in an insulator phase at the predetermined temperature or less, the internal state quantity S10 is the RMS of the voltage applied to the first end with respect to the second end within the predetermined time period (a second time period). In equation 1, when A represents a constant, $f(V_{in})=A \times V_{in}^2$.

Sixth Embodiment

Figure 17:
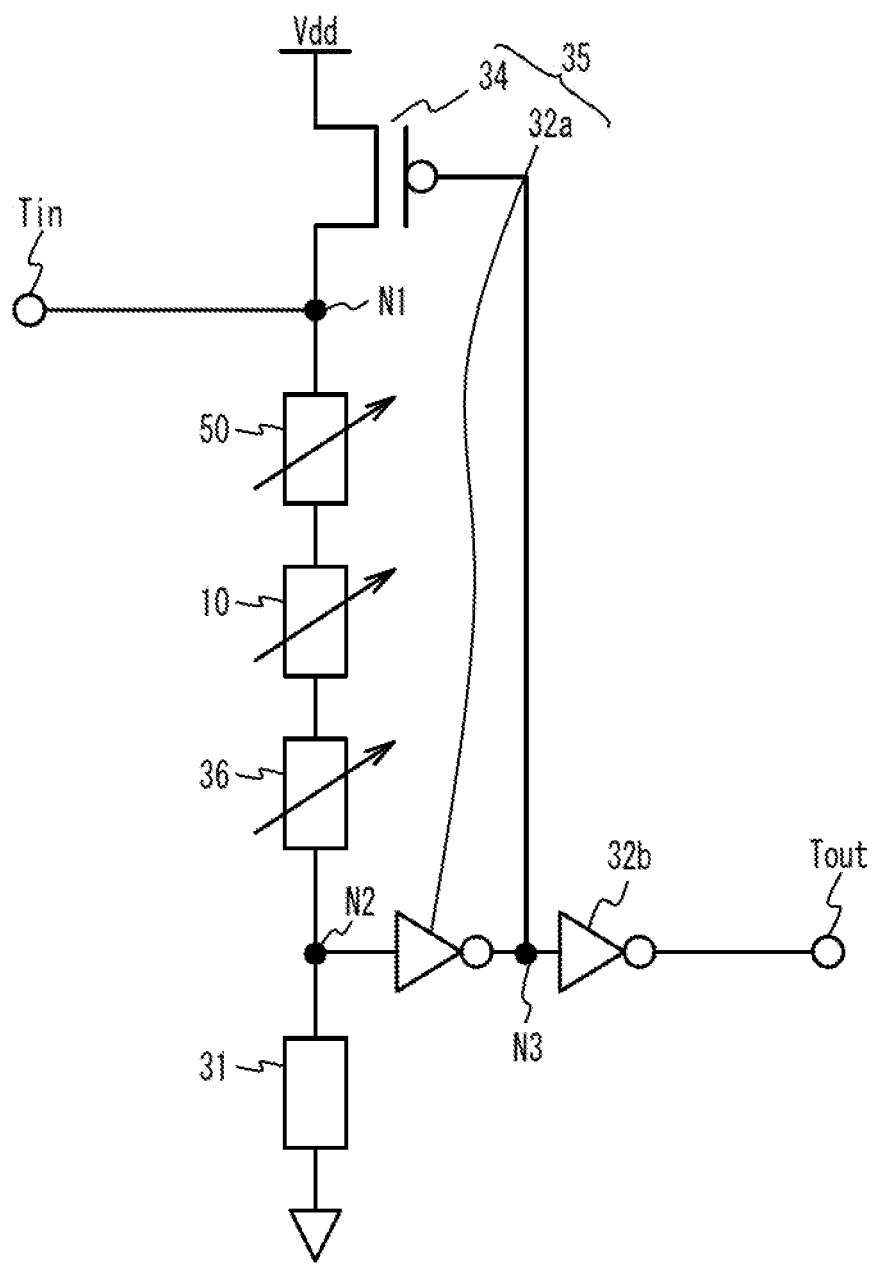
FIG. 17 is a circuit diagram of a neuron circuit in accordance with a sixth embodiment.

FIG. 17 is a circuit diagram of a neuron circuit in accordance with a sixth embodiment. As illustrated in FIG. 17, between the nodes N1 and N2, a switch element 50 is connected in series with the switch elements 10 and 36. The switch element 50 is the same switch element as the switch element 10 except that the relaxation time of the internal state quantity, the threshold value for the internal state quantity, the low resistance value, and the high resistance value differ from those of the switch element 10. Other structures are the same as those of the fifth embodiment, and the description thereof is thus omitted.

Figure 18:
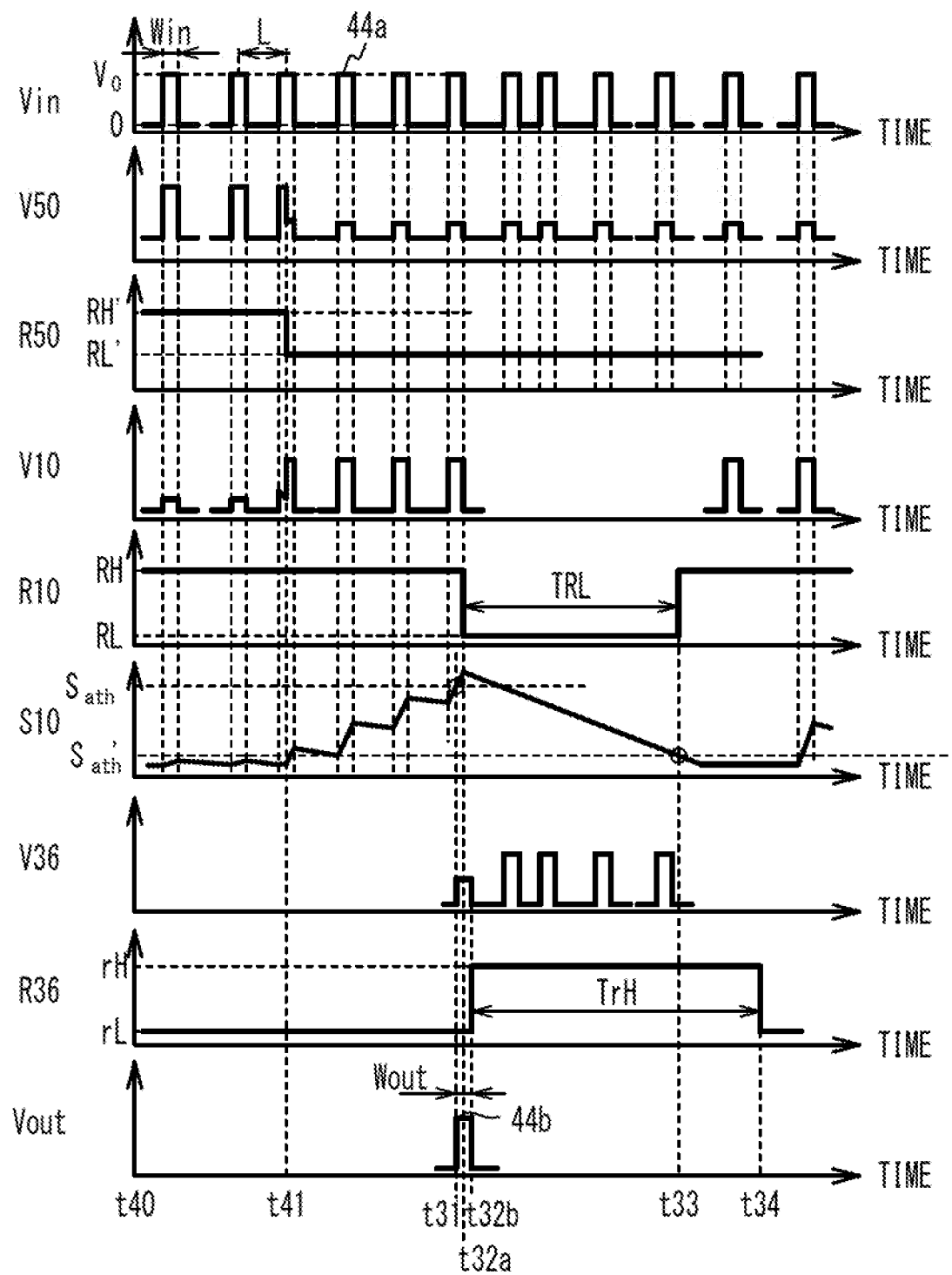
FIG. 18 is a timing chart of the neuron circuit in the sixth embodiment.

FIG. 18 is a timing chart of the neuron circuit in the sixth embodiment. Illustrated are variations over time in the input voltage Vin, the voltage V50 and the resistance value R50 between both ends of the switch element 50, the voltage V10 and the resistance value R10 and the internal state quantity S10 between both ends of the switch element 10, the voltage V36 and the resistance value R36 between both ends of the switch element 36, and the output voltage Vout.

As illustrated in FIG. 18, at time t40, the resistance value R50 of the switch element 50 is a high resistance RH', the resistance value R10 of the switch element 10 is the high resistance RH, and the resistance value of the switch element 36 is the low resistance rL. A plurality of spike signals 44a are input as the input voltage Vin.

The switch elements 10 and 50 are applied with partial voltages of the voltage $V_0$ of the spike signal 44a divided at the ratio of RH:RH'. When RH'>RH, the voltage of the spike signal 44a is mainly applied to the switch element 50, and is hardly applied to the switch element 10. Thus, the internal state quantity of the switch element 50 increases, but the internal state quantity S10 of the switch element 10 hardly increases.

When the internal state quantity of the switch element 50 becomes greater than the threshold value at time t41, the resistance value of the switch element 50 becomes a low resistance RL'. The switch elements 10 and 50 are applied with partial voltages of the voltage $V_0$ of the spike signal 44a divided at the ratio of RH:RL'. When RL'<RH, the voltage of the spike signal 44a is mainly applied to the switch element 10, and is hardly applied to the switch element 50. Thus, the internal state quantity S10 of the switch element 10 increases, but the internal state quantity of the switch element 50 hardly increases.

When the internal state quantity S10 of the switch element 10 becomes greater than the threshold value $S_{ath}$ at time t31, the resistance value of the switch element 10 becomes the low resistance RL. The resistance value of the switch element 50 preferably remains the low resistance RL' even after time t31. The operation thereafter is the same as that of the fifth embodiment, and the description thereof is thus omitted.

Since the high level and the low level of the output terminal Tout are switched according to the changes in resistances of the switch elements 10, 36, and 50, when the resistance value of the load resistor 31 is represented by R31, RH, rH, RH'>R31>RL, rL, RL' is preferable.

As in the fourth embodiment, the width Win of the spike signal 44a is preferably shorter than $\tau_{on}(RH/(RH+RH')V_0)$ and $\tau_{on}'(RH'/(RH+RH')V_0)$. Here, $\tau_{on}(RH/(RH+RH')V_0)$ is the period until the resistance value of the switch element 10 becomes the low resistance RL when the switch element 10 is applied with the partial voltage $RH/(RH+RH')V_0$ of the voltage $V_0$ of the spike signal 44a. In addition, $\tau_{on}'(RH'/(RH+RH')V_0)$ is the period until the resistance value of the switch element 50 becomes the low resistance RL' when the switch element 50 is applied with the partial voltage $RH'/(RH+RH')V_0$ of the voltage V0 of the spike signal 44a.

The interval L of the spike signals 44a is preferably shorter than the relaxation time $\tau_{dec}$, and $T_{dec}'$. Here, $T_{dec}'$ is the relaxation time of the internal state quantity of the switch element 50.

Figure 19A:
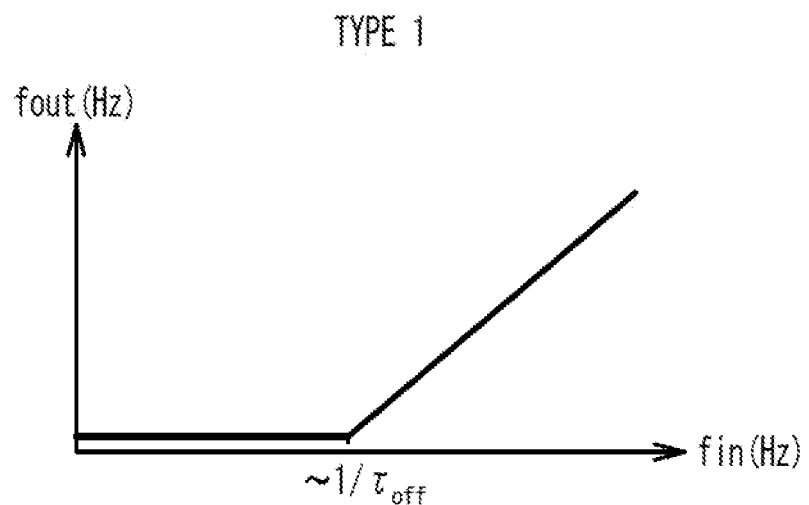
FIG. 19A and FIG. 19B illustrate output frequencies of the neuron circuits of the fifth and sixth embodiments with respect to input frequency, respectively.
Figure 19B:
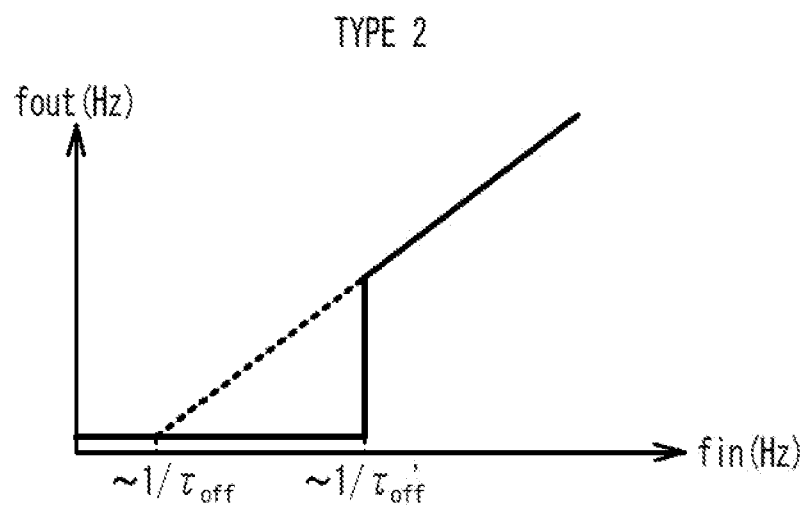

FIG. 19A and FIG. 19B are graphs of the output frequency of the neuron circuits of the fifth and sixth embodiments versus the input frequency, respectively. The input frequency fin is a frequency at which the spike signal 44a is input. The output frequency font is a frequency at which the spike signal 44b, which is the output signal, is output.

As illustrated in FIG. 19A, in the fifth embodiment, when fin is low (i.e., the interval L of the spike signals 44a is long), the spike signal 44b is not output. When fin becomes approximately $1/\tau_{off}$ of the switch element 10, the spike signal 44b starts to be output. As fin increases, font increases. That is, as the interval L of the spike signals 44a decreases, the interval of the spike signals 44b decreases.

As illustrated in FIG. 19B, in the sixth embodiment, even when fin becomes approximately $1/\tau_{off}$ of the switch element 10, the spike signal 44b is not output. When fin becomes approximately $1/\tau_{off}'$ of the switch element 50, the spike signal 44b is output. Here, font discontinuously rises at $1/\tau_{off}'$.

The neuron circuit in which font continuously rises as in the fifth embodiment illustrated in FIG. 19A is referred to as a type 1, and the neuron circuit in which font discontinuously rises as in the sixth embodiment illustrated in FIG. 19B is referred to as a type 2. The neuron circuits of the type 1 and the type 2 are applied to neural circuits.

In the sixth embodiment, the switch element 50 is connected in series with the switch elements 10 and 36 between the input terminal Tin and the node N2. The connection order of the switch elements 10, 36 and 50 is freely determined. The switch element 50 remains in the high resistance state even when a single spike signal 44a is input, and goes into the low resistance state when a plurality of spike signals 44a are input within a third time period. This configuration achieves the neuron circuit of the type 2.

It is preferable that the resistance value RH' of the high resistance state of the switch element 50 is higher than the resistance value RH of the high resistance state of the switch element 10, and the resistance value RL' of the low resistance state of the switch element 50 is lower than the resistance value RH of the high resistance state of the switch element 10. This configuration achieves the neuron circuit of the type 2 as illustrated in FIG. 18.

Instead of the switch element 36, a capacitor may be connected in parallel with the switch element 10.

The switch elements 10 and 50 may employ zinc oxide or strontium titanate as the resistor 14 besides vanadium oxide as described in the first embodiment. The resistor 14 may be formed of a metallic insulator material such as vanadium oxide as in Non-Patent Document 1 or niobium oxide as in Non-Patent Document 2. The resistor 14 may be formed of a copper compound, chalcogenide, tungsten oxide, or amorphous oxide employed in Non-Patent Documents 3 through 6.

For example, a description will be given of the preferable dimensions of the resistor 14 when vanadium oxide $VO_2$ is used as the resistor 14. It is assumed that the resistor 14 is a cube having a×b×c. To allow $VO_2$ to maintain the phase transition characteristics, a, b and c are preferably 3 nm or greater. To reduce the size, the film thickness among a, b, and c is preferably 1 μm or less, and the remaining dimensions are preferably 1 mm or less.

When it is assumed that the resistivity of $VO_2$ is 10 Ω·cm, the resistance value of the switch element 10 required for the neuron circuit is 10Ω to 1 GΩ, the interelectrode distance is a (cm), and other two sides have lengths of b and c (cm), $10 < a/(b \times c) < 10^9$ is preferable.

As described in the third embodiment, the switch element 36 may use, for example, an Esaki diode or a Gunn diode. The switch element 36 may be a trap element using a metallic oxide as in Non-Patent Document 7, an organic substance as in Non-Patent Document 8, or a semiconductor as in Non-Patent Document 9. The switch element 36 may be a unipolar resistance switch element using chalcogenide as in Non-Patent Document 10 or a metallic oxide as in Non-Patent Document 11. When the switch element as described in Non-Patent Documents 7 through 11 is used as the switch element 36, the initial state is preferably configured to be a low resistance state (on state).

Seventh Embodiment

A seventh embodiment is an exemplary switch circuit which is a more generalized alternate current circuit of the second embodiment. As illustrated in FIG. 6, a first end of the switch element 10 is coupled to the line 22 between the input terminal Tin and the output terminal Tout, and a second end of the switch element 10 is coupled to a reference potential terminal. The resistor 14 of the switch element 10 is in the high resistance state when the internal state quantity S10 is less than the threshold value $S_{th}$', and is in the low resistance state when the internal state quantity S10 is greater than the threshold value $S_{th}$. The internal state quantity S10 is expressed by equation 1. In this case, the cycle period of variation in the input signal is shorter than the relaxation time $\tau_{dec}$. Thus, the alternate current limiting circuit of FIG. 6 functions as a switch circuit that limits a signal when the amplitude of the input signal is large.

In the fourth through seventh embodiments, the switch circuit and the neuron circuit can be achieved without a capacitor. Thus, the chip area is reduced.

[Experiment 1]

To substantiate the operation of the neuron circuit of the sixth embodiment, a neuron circuit was fabricated. Since the switch element 36 was not available, instead of the switch element 36, a reset negative feedback circuit that resets firing, and a refractory negative feedback circuit that provides a refractory period are provided.

Figure 20:
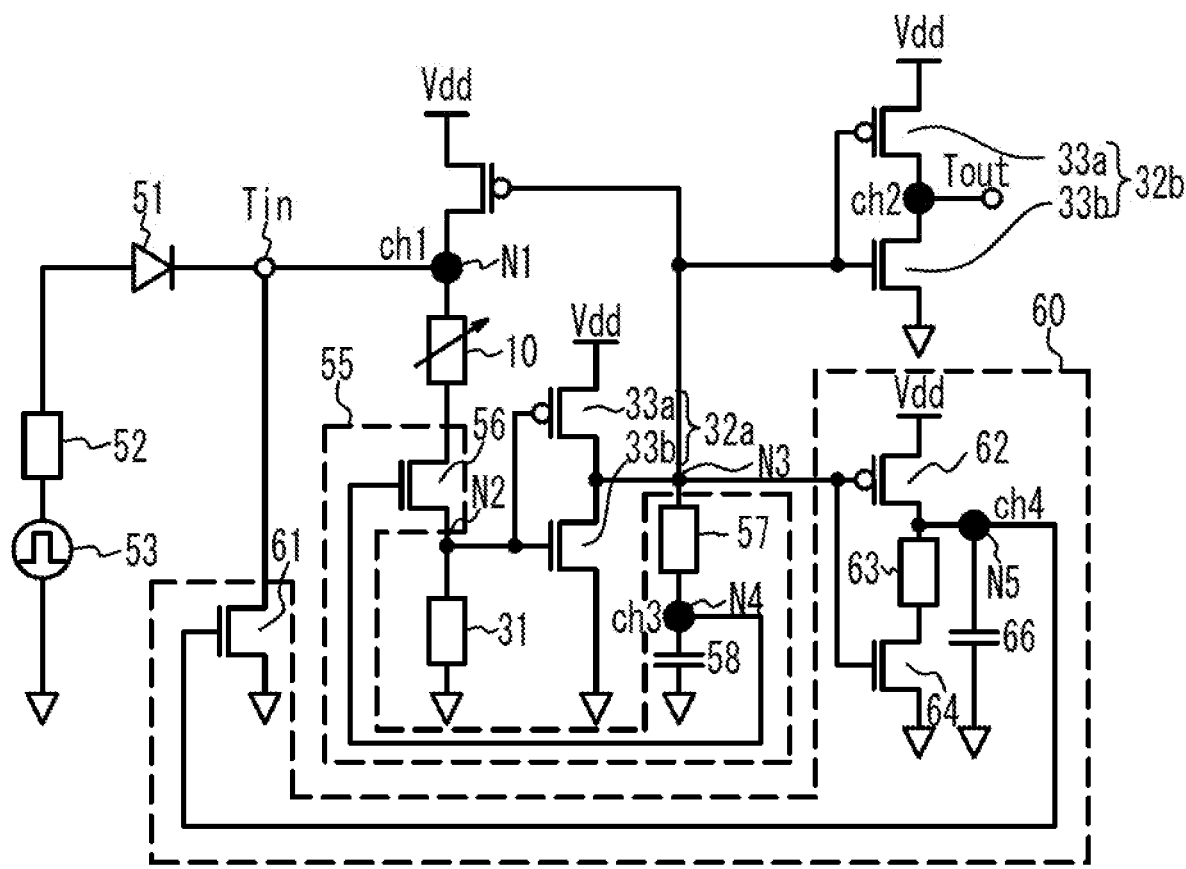
FIG. 20 is a circuit diagram of a neuron circuit fabricated in an experiment 1.

FIG. 20 is a circuit diagram of the neuron circuit fabricated in the experiment 1. As illustrated in FIG. 20, a resistor 52 with 50 Ω and a pulse generator 53 are connected to the input terminal Tin through a diode 51. In the switch element 10, vanadium oxide is used as the resistor 14. A reset negative feedback circuit 55 is a circuit corresponding to the reset function of the switch element 36. A refractory negative feedback circuit 60 is a circuit corresponding to the refractory function of the switch element 36.

An NFET 56, as the reset negative feedback circuit 55, is connected in series with the switch element 10 between the nodes N1 and N2. The node N3 is grounded through a resistor 57 with 1 kΩ and a capacitor 58 with 4.2 nF. A node N4 between the resistor 57 and the capacitor 58 is coupled to the gate of the NFET 56.

An NFET 61, as the refractory negative feedback circuit 60, is connected between the input terminal Tin and a ground. A PFET 62, a resistor 63 with 1.4 kΩ, and an NFET 64 are connected between the power source and a ground. The node N3 is coupled to the gate of the PFET 62 and the gate of the NFET 64. A capacitor 66 with 220 nF is connected between a node N5, which is between the PFET 62 and the resistor 63, and a ground. The node N5 is coupled to the gate of the NFET 61.

Figure 21:
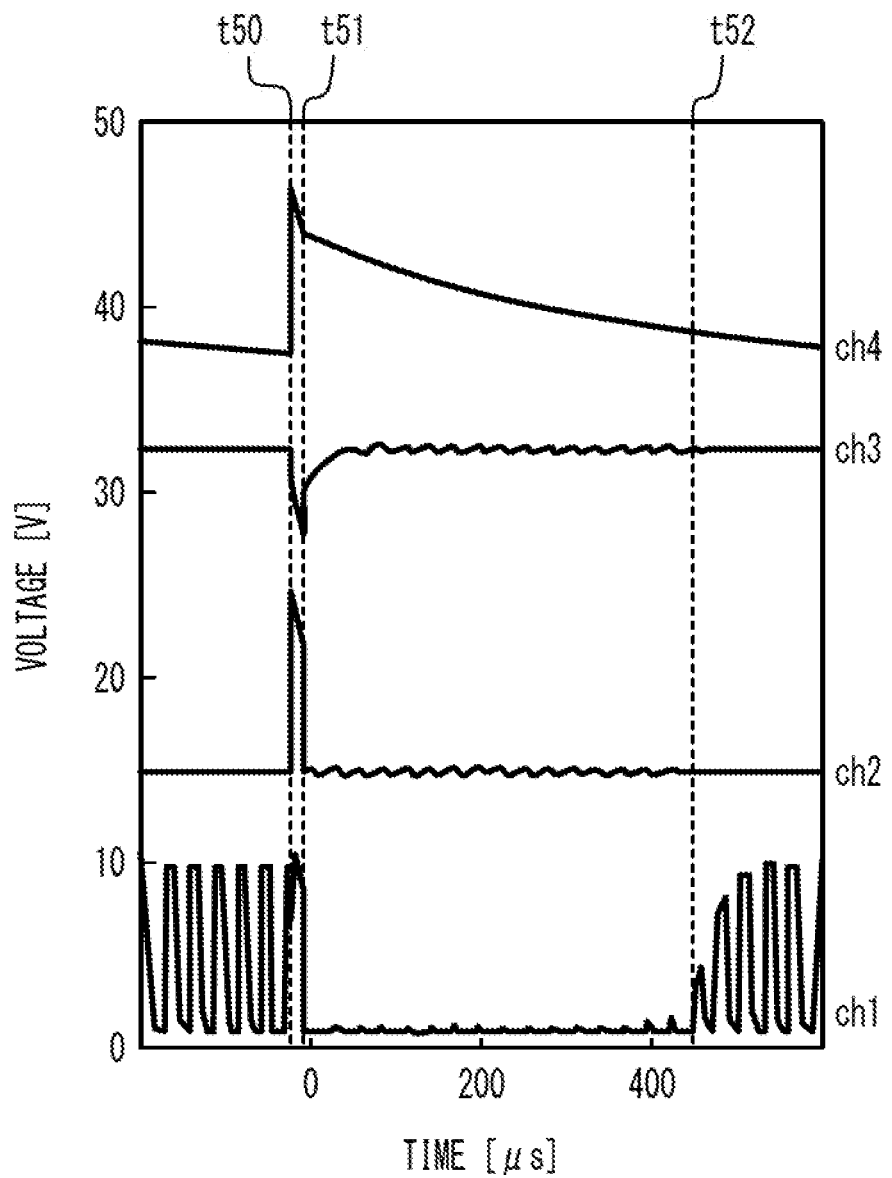
FIG. 21 illustrates voltages of channels ch1 through ch4 with respect to time in the experiment 1.

FIG. 21 is a graph of voltages of channels ch1 through ch4 versus time in the experiment 1. The channels ch1 through CM correspond to the node N1, the output terminal Tout, the node N4, and the node N5, respectively. The channel ch1 corresponds to the voltage applied to both ends of the switch element 10. The channel ch2 corresponds to the output signal. The channel ch3 corresponds to a reset negative feedback. The channel ctrl corresponds to a refractory negative feedback. In FIG. 21, the waveforms of ch2, ch3, and ch4 are offset from the waveform of the channel ch1 in voltage so that the waveforms of the channels ch1 through ch4 do not overlap with each other.

The power source voltage Vdd was set at 10 V, and the spike signal with a frequency of 40 kHz was output from the pulse generator 53. At time t50, firing occurs, and at time t51, reset is conducted. The period to time t52 is the refractory period.

Figure 22:
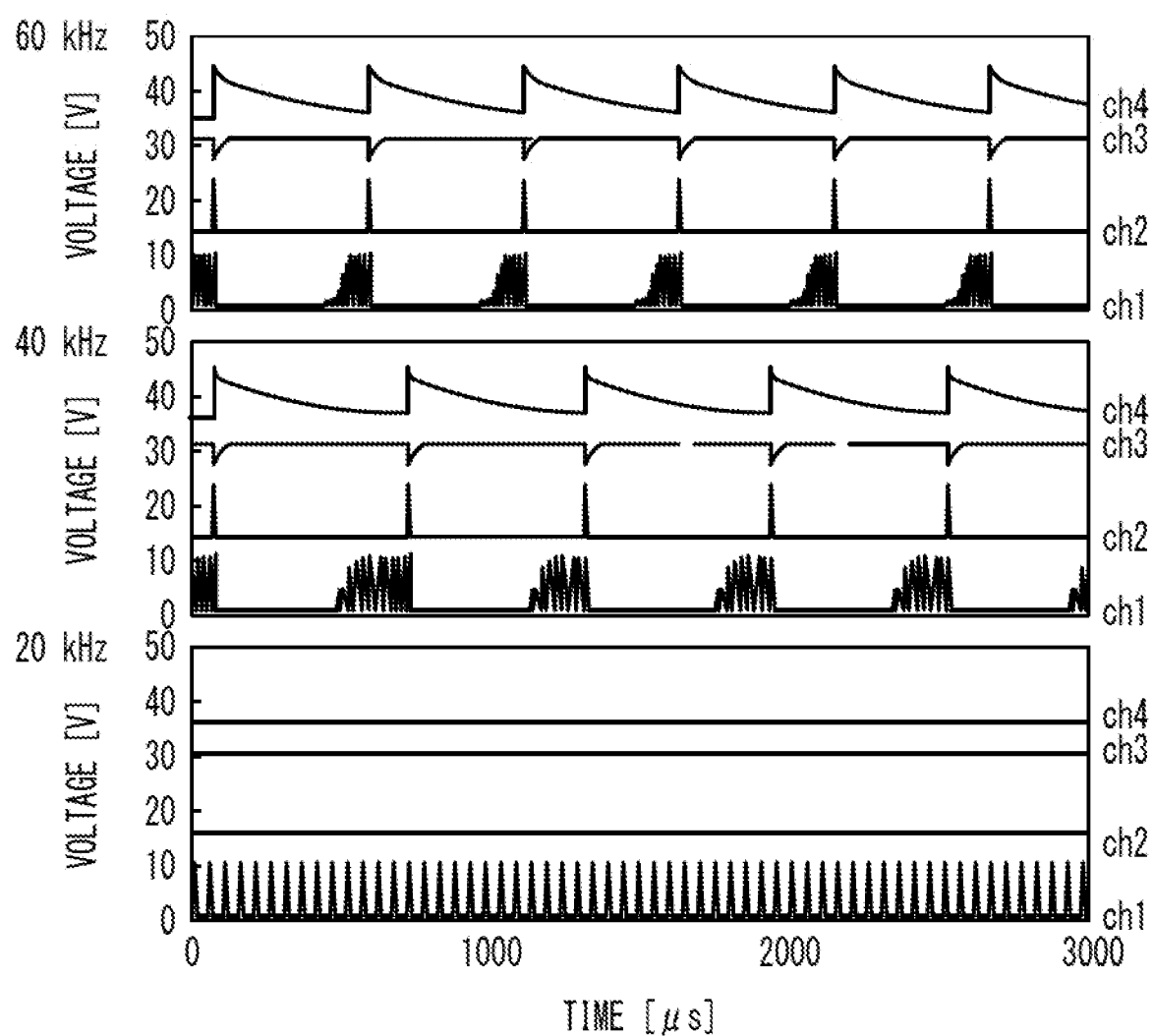
FIG. 22 illustrates voltage with respect to time when the frequency of an input signal was varied in the experiment 1.

FIG. 22 illustrates voltage with respect to time when the frequency of the input signal was varied in the experiment 1. As illustrated in FIG. 22, when the frequency of the spike signal of the input signal is 20 kHz, the spike signal is not output to the ch2. When the frequency is 40 kHz and 60 kHz, the spike signal is output to ch2. The period of the spike signal of ch2 when the frequency is 60 kHz is greater than that when the frequency is 40 kHz. As seen above, the switch element 10 using vanadium oxide achieves a neuron circuit that has no response to the input signal with low frequency (i.e., infrequent).

Eighth Embodiment

Figure 23:
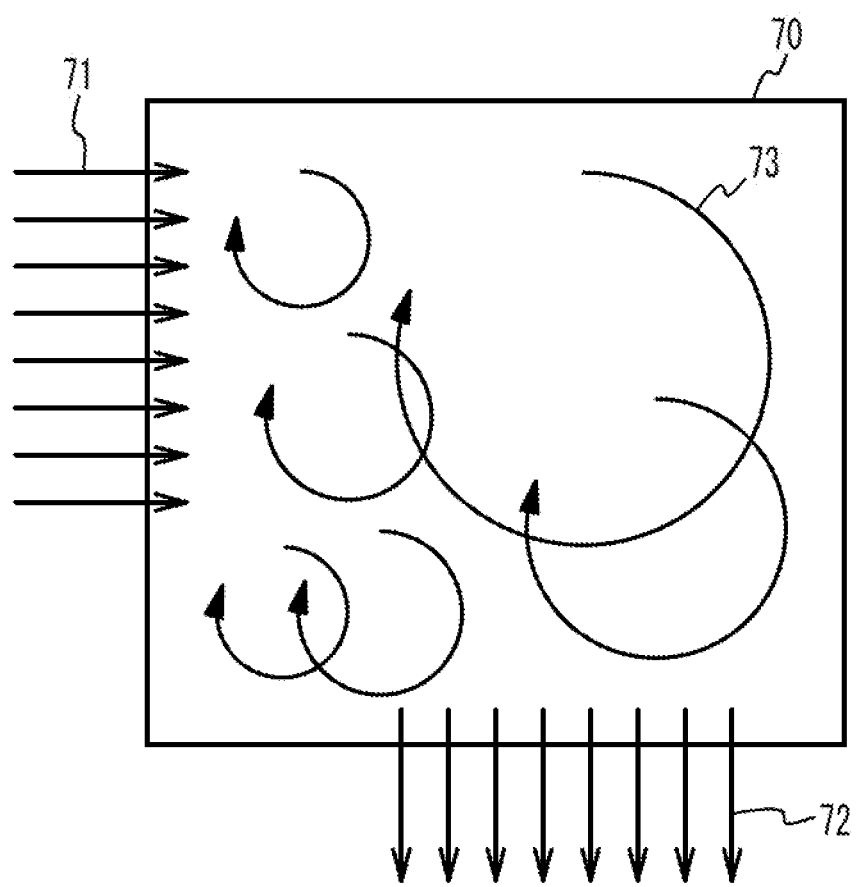
FIG. 23 is an overview diagram of a system in accordance with an eighth embodiment.

An eighth embodiment is an exemplary system in which the third, fifth, and sixth embodiments are used. FIG. 23 is an overview of a system in accordance with the eighth embodiment. As illustrated in FIG. 23, a plurality of spike signals 71 are input to a system 70 in parallel. The spike signals 71 are, for example, visual information, audio information, tactile information, and the like. A plurality of spike signals 72 are output from the system 70 in parallel. The spike signals 72 are used to, for example, drive an actuator and adjust various control parameters.

In the system 70, a neuron circuit and a synaptic circuit form a network. The system 70 operates by exchanging the spike signals in the network. Many attractors 73 are formed in the network. The "dynamic steady state" in which firing activities are maintained by a plurality of neuron circuits exciting each other even when the spike signal 71 is not input to the system 70 from the outside is referred to as the attractor 73. "Dynamic" means that the neuron circuit in the steady state is not at rest, but is in periodic, quasi-periodic, or chaotic motion by firing. Input of the spike signal 71 generates the attractor 73 and/or switches the attractor 73. The spike signal 72 is generated by the attractor 73.

Figure 24:
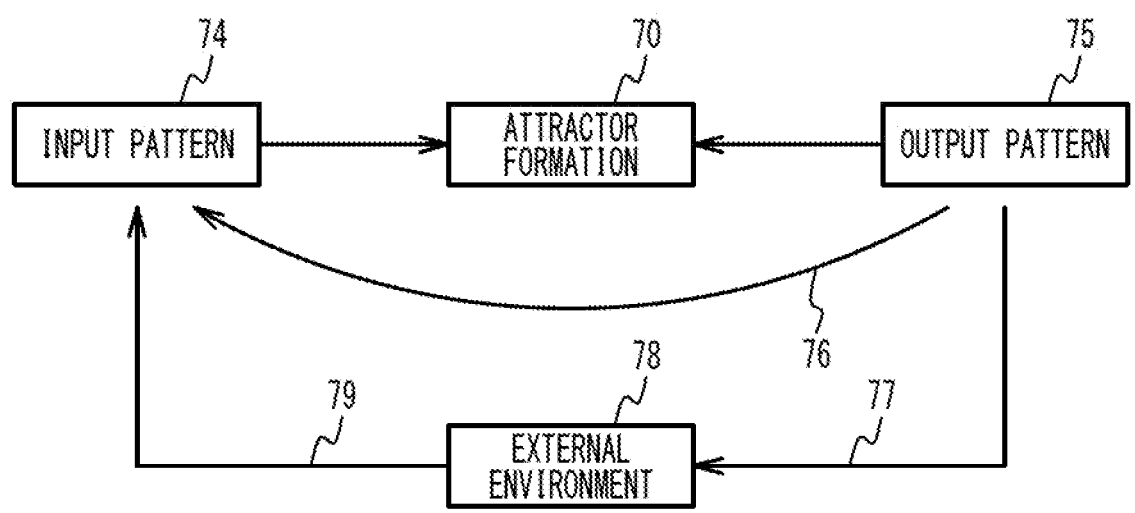
FIG. 24 is a block diagram illustrating the operation of the system in accordance with the eighth embodiment.

FIG. 24 is a block diagram illustrating the operation of the system in accordance with the eighth embodiment. As illustrated in FIG. 24, an input pattern 74 of the spike signal is input to the system 70. In the network, an attractor of the spike signal having a spationaltemporal pattern common to the input pattern 74 is formed. Among exchanges of spike signals caused by the input pattern 74, those that occasionally form a looped feedback are dynamically stabilized as attractors. The attractor corresponding to the frequently-input spationaltemporal pattern updates the conductivity of the synaptic circuit, and is further stabilized. This is learning. The stabilized attractor is easily induced by noise or the similar input pattern 74.

An output pattern 75 generated by the attractor is fed back as the input pattern 74 again as indicated by a path 76. In addition, the output pattern 75 works on an external environment 78 through the actuator as indicated by a path 77. The input pattern 74 is obtained from the external environment 78 as indicated by a path 79.

Figure 25A:
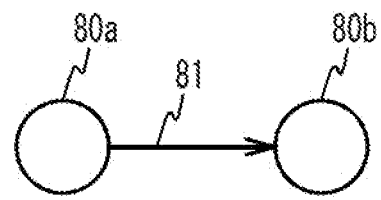
FIG. 25A through FIG. 25C are diagrams for describing a synaptic circuit in the eighth embodiment.
Figure 25B:
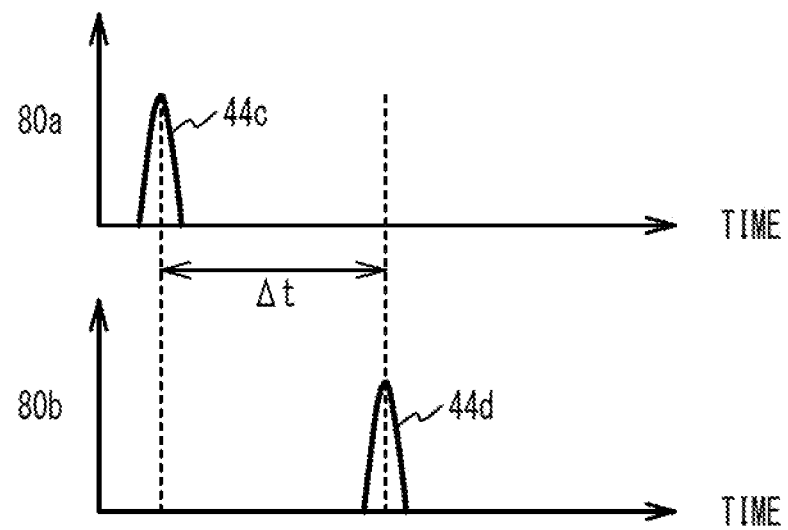
Figure 25B:
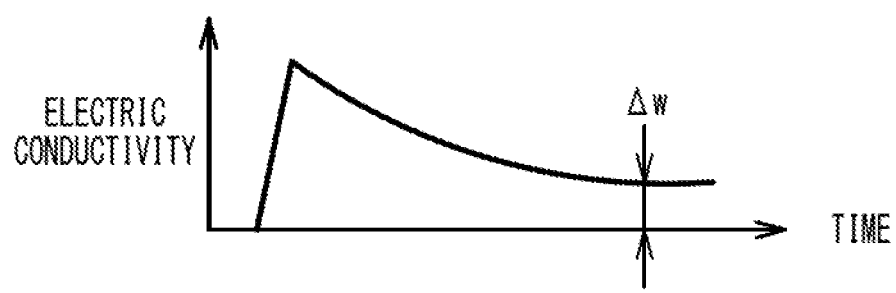
Figure 25C:
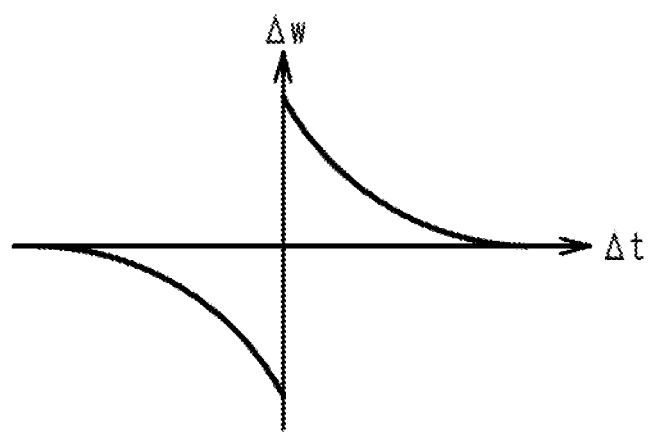

FIG. 25A through FIG. 25C are diagrams for describing the synaptic circuit in the eighth embodiment. FIG. 25A illustrates the connection of the synaptic circuit. As illustrated in FIG. 25A, a synaptic circuit 81 is connected between neuron circuits 80a and 80b.

FIG. 25B is a timing chart of a spike signal 44c from the neuron circuit 80a, a spike signal 44d from the neuron circuit 801), and the electric conductivity of the synaptic circuit 81. As illustrated in FIG. 25B, the transmission period of the spike signal from the neuron circuit 80a to the neuron circuit 80b through the synaptic circuit 81 is $\Delta t$. The electric conductivity of the synaptic circuit 81 is determined by the transmission of the spike signal. When the neuron circuit 80a tires and the spike signal 44c is input to the synaptic circuit 81, the electric conductivity of the synaptic circuit 81 temporarily rises. Thereafter, the electric conductivity of the synaptic circuit 81 relaxes for a certain time constant. When the neuron circuit 80b fires during the relaxation of the electric conductivity of the synaptic circuit 81. the electric conductivity after the relaxation changes by Aw depending on the timing of firing. This phenomenon is called spike-timing-dependent plasticity (STDP). The STDP is an underlining function of the learning function.

FIG. 25C illustrates an update rule of the STDP in the synaptic circuit 81. As illustrated in FIG. 25C, when the period $\Delta t$ is near 0, the absolute value of $\Delta w$ is large, and as the period $\Delta t$ is distant from 0, the absolute value of Aw decreases. The synaptic circuit 81 preferably has the above-described STDP function. Those described in, for example, IEEE Transaction on Neural Networks Vol. 17, pp. 211-221 (2006), IEDM 14-665 28.5.1-28.5.4 (2014) and Nature Materials Vol. 16, pp. 101-110 (2017) can be used as the synaptic circuit.

Figure 26:
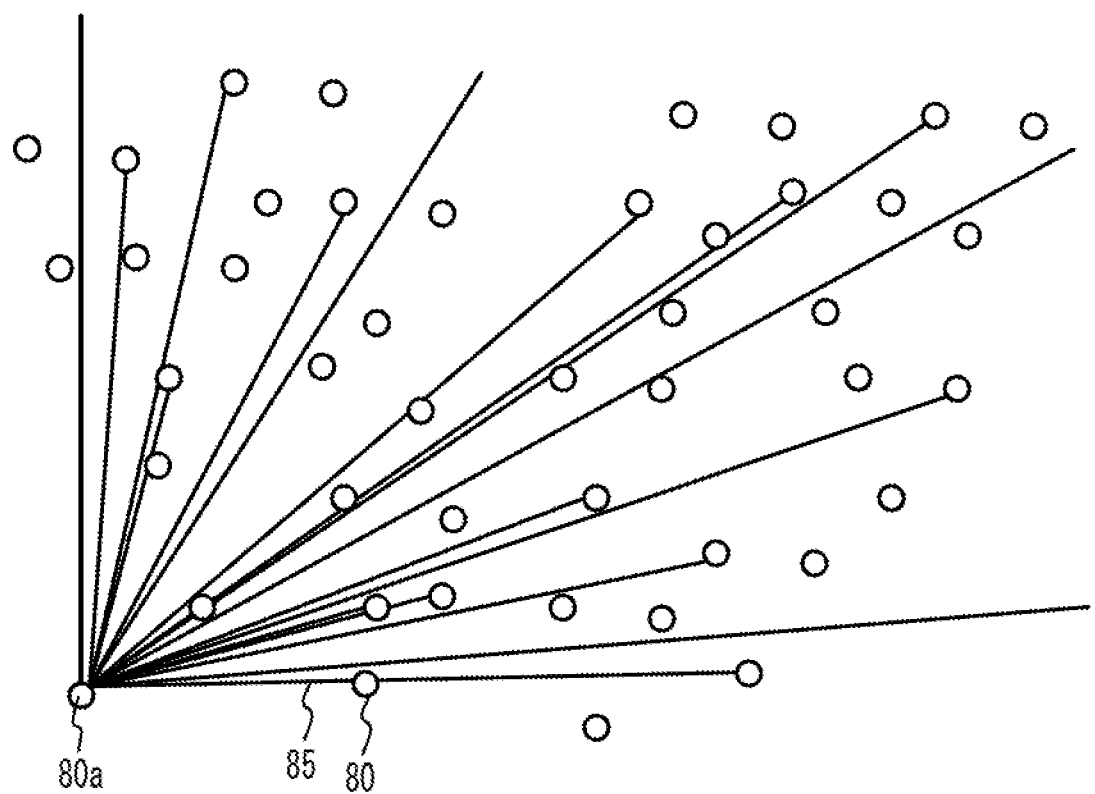
FIG. 26 illustrates a connection structure of a network in the eighth embodiment.

FIG. 26 illustrates a connection structure of the network in the eighth embodiment. FIG. 26 focuses on one neuron circuit 80a of a plurality of neuron circuits 80, and conceptually illustrates the neuron circuit 80 connected in a three-dimensional space. As illustrated in FIG. 26, a plurality of neuron circuits 80 are connected to the neuron circuit 80a through connection lines 85. The connection lines 85 include the synaptic circuit 81 and simple wiring lines. One neuron circuit 80a is connected to, for example, approximately 100 to 10000 neuron circuits 80. The neuron circuit 80a is evenly connected to the neighbor neuron circuit 80 and the distant neuron circuit 80. A delay time proportional to the connection distance occurs in transmission of the spike signal. A spatial pattern can be extracted from the spatial arrangement of the neuron circuits 80, and a temporal pattern can be extracted from the delay times of the spike signals. Accordingly, the attractor corresponding to the spationaltemporal pattern of the input pattern is formed.

Figure 27:
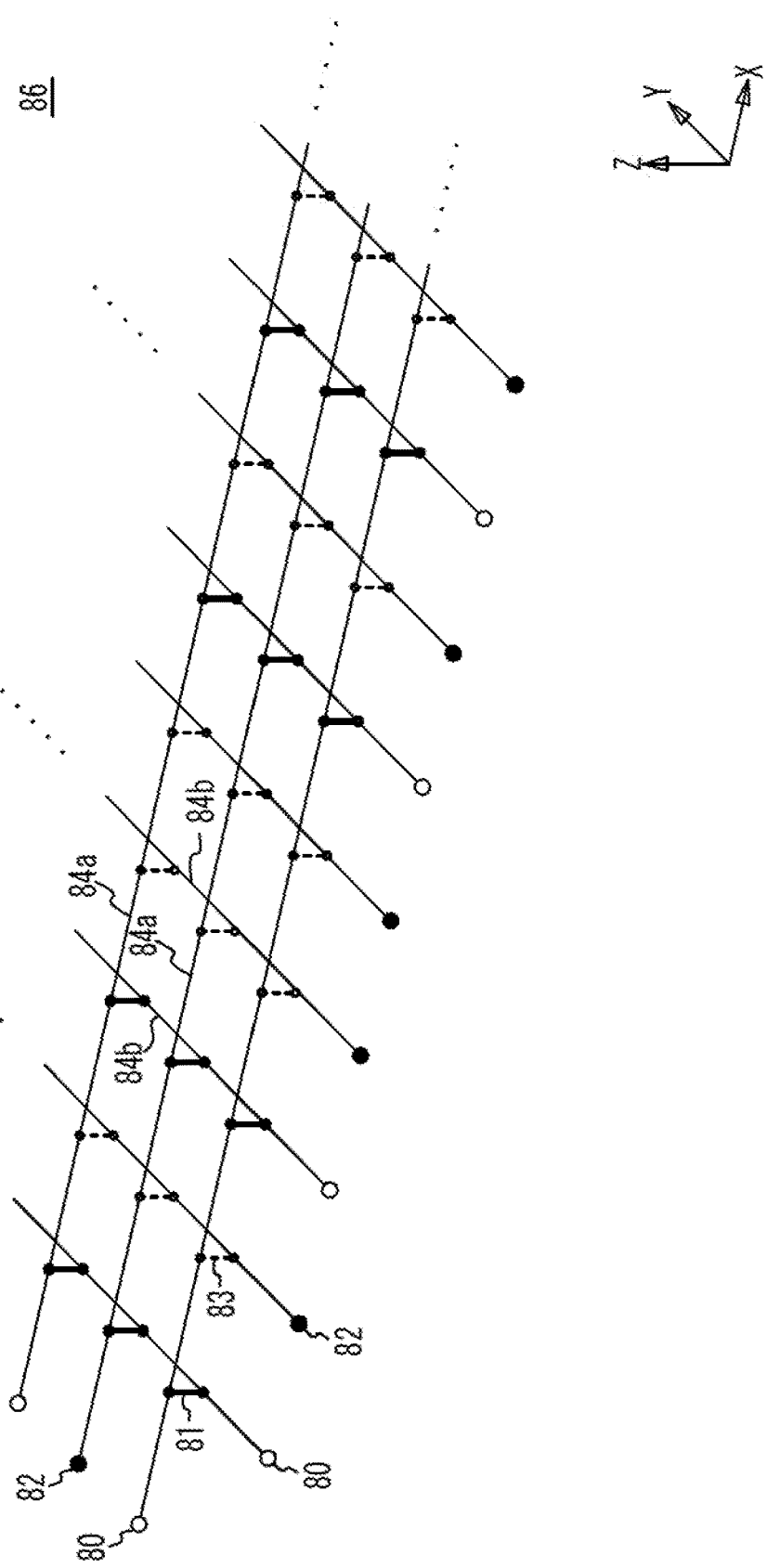
FIG. 27 illustrates a crossbar array circuit in the eighth embodiment.

FIG. 27 illustrates a crossbar array circuit in the eighth embodiment. As illustrated in FIG. 27, in the crossbar allay circuit 86, a plurality of wiring lines 84a extend in the X direction, and a plurality of wiring lines 84b extend in the Y direction. The neuron circuits 80 and delay elements 82 are located in the end portions of the wiring lines 84a and 84b. The wiring line 84a and the wiring line 84b are away from each other in the Z direction. At the intersection of the wiring line 84a and the wiring line S4b, the synaptic circuit 81 or simple wiring line 83 extends in the Z direction, and connects the wiring lines 84a and 84b. The synaptic circuit 81 is connected to the wiring line 84b to which the neuron circuit 80 is connected. The simple wiring line 83 is connected to the wiring line 84b to which the delay element 82 is connected. The delay element 82 and the simple wiring line 83 are for connecting the distant neuron circuit 80. The delay elements 82, for example, approximately nine times as many as the neuron circuits 80 are arranged. In addition to the neuron circuit 80 outputting the positive spike signal, the neuron circuit 80 outputting the negative spike signal is arranged. The ratio of the neuron circuit 90 outputting the negative spike signal to the entire neuron circuits is, for example, approximately 20%.

Figure 28:
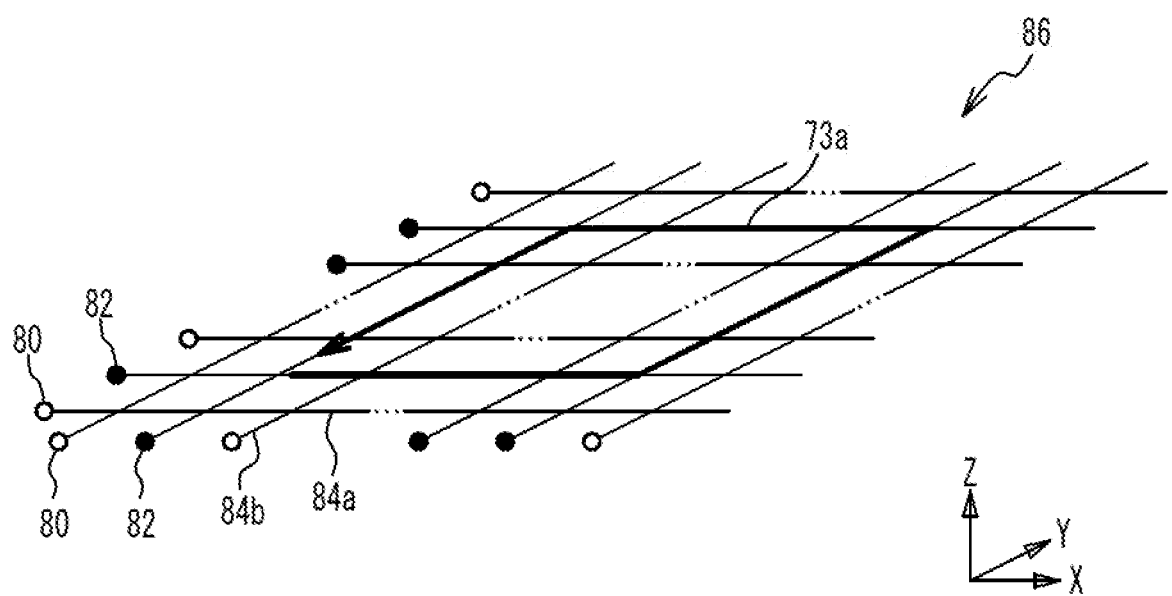
FIG. 28 illustrates a two-dimensional network architecture in the eighth embodiment.

FIG. 28 illustrates a two-dimensional network architecture in the eighth embodiment. As illustrated in FIG. 28, a two-dimensional crossbar array circuit 86 is provided. The wiring lines 84a and 84b extend in the X direction and the Y direction. The illustration of the synaptic circuit 81 and the simple wiring line 83 is omitted. A two-dimensional attractor 73a is formed through the wiring lines 84a and 84b. The attractor 73a indicates a simple attractor of the attractors 73 illustrated in FIG. 23. In the attractor 73a, the neuron circuits 80 connected in a loop shape sequentially fire the next neuron circuit 80.

Figure 29:
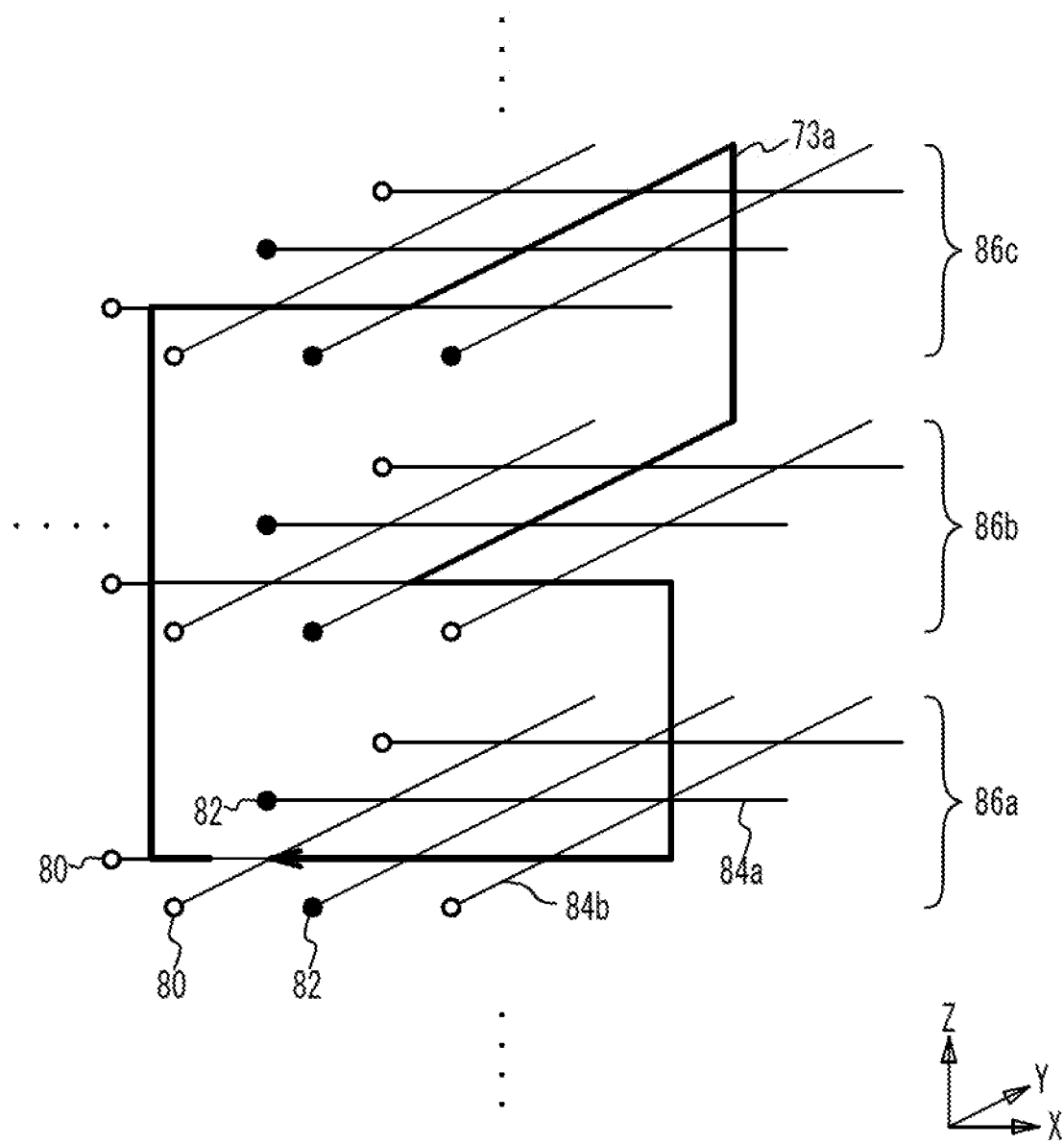
FIG. 29 illustrates a three-dimensional network architecture in the eighth embodiment. embodiment.

FIG. 29 is a three-dimensional network architecture in the eighth embodiment. As illustrated in FIG. 29, two-dimensional crossbar array circuits 86a through 86c are stacked in the Z direction. Wiring lines connecting the crossbar array circuits 86a through 86c in the Z direction are provided. The crossbar array circuits 86a through 86c form the three-dimensional attractor 73a.

As in FIG. 28 and FIG. 29, use of the crossbar array circuit 86 in FIG. 27 enables to form the two-dimensional or three-dimensional attractor 73a.

As illustrated in the eighth embodiment, use of the neuron circuit 80 of the third, fifth, and sixth embodiments and the synaptic circuit 81 enables to form a system corresponding to the neural circuit.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10, 36, 50 switch element
12 substrate
14 resistor
14a active portion
14b extraction portion
16 electrode
22 line
24 impedance element
31 load resistor
35 feedback circuit
40a, 40b neuron
42a, 42b synapse
44a-44d spike signal

The invention claimed is:

1. A neuron circuit comprising:
an input terminal to which spike signals are continuously input;
a first switch element that has a first end coupled to the input terminal and a second end coupled to an intermediate node, remains in a high resistance state even when a single spike signal is input, and goes into a low resistance state, of which a resistance value is lower than that of the high resistance state, when a plurality of spike signals are input within a first time period;
a feedback circuit coupled to the intermediate node, and causing the input terminal to be at a predetermined level when the first switch element goes into the low resistance state; and
a second switch element that is connected in series with the first switch element between the input terminal and the intermediate node, remains in a low resistance state even when one or more spike signals are input to the input terminal, and goes into a high resistance state when the input terminal becomes at the predetermined level.

2. The neuron circuit according to claim 1, further comprising a load connected between the intermediate node and a reference potential terminal.

3. The neuron circuit according to claim 2, wherein the predetermined level high level.

4. The neuron circuit according to claim 1, wherein
the first switch element includes a resistor that is connected between the first end and the second end, is in a high resistance state when an internal state quantity that is an average of a voltage applied to the first end with respect to the second end within a second time period is less than a first threshold value, and is in a low resistance state when the internal state quantity is greater than a second threshold value.

5. The neuron circuit according to claim 4, wherein the resistor is in a metallic phase at a predetermined temperature or greater and is in an insulator phase at the predetermined temperature or less, and
the internal state quantity is an RMS of the voltage applied to the first end with respect to the second end within the second time period.

6. The neuron circuit according to claim 1, wherein
the first switch element includes a resistor that is connected between the first end and the second end, is in a high resistance state when an internal state quantity is less than a first threshold value, and is in a low resistance state when the internal state quantity is greater than a second threshold value, and
the internal state quantity $S(T_0)$ at time $T_0$ is $$S(T_0) = \int_0^{T_0} f(V_{10}(T_0-T)) e^{-T/\tau_{dec}} dT$$

where a voltage between the first end and the second end is represented by $V_{10}$, an effect of $V_{10}$ on the internal state quantity is represented by $F(V_{10})$, and a relaxation time of the internal state quantity is represented by $\tau_{dec}$.

7. The neuron circuit according to claim 6, wherein
the resistor is in a metallic phase at a predetermined temperature or greater and is in an insulator phase at the predetermined temperature or less, and $f(V_{10}) = A \times v_{10}^2$ where A represents a constant.

8. The neuron circuit according to claim 4, wherein the resistor is formed of vanadium oxide.

9. The neuron circuit according to claim 1, further comprising
a third switch element that is connected in series with the first switch element and the second switch element between the input terminal and the intermediate node, remains in a high resistance state even when a single spike signal is input, and goes into a low resistance state when a plurality of the spike signals are input within a third time period.

10. The neuron circuit according to claim 9, wherein
a resistance value of the high resistance state of the third switch element is higher than a resistance value of the high resistance state of the first switch element, and
a resistance value of the low resistance state of the third switch element is lower than a resistance value of the high resistance state of the first switch element.

11. A system comprising:
neuron circuits, each including:
an input terminal to which a spike signal is continuously input,
a first switch element that has a first end coupled to the input terminal and a second end coupled to an intermediate node, remains in a high resistance state even when a single spike signal is input, and goes into a low resistance state, of which a resistance value is lower than that of the high resistance state, when a plurality of spike signals are input within a first time period,
a feedback circuit coupled to the intermediate node, and causing the input terminal to be at a predetermined level when the first switch element goes into the low resistance state, and a second switch element that is connected in series with the first switch element between the input terminal and the intermediate node, remains in a low resistance state even when one or more spike signals are input to the input terminal, and goes into a high resistance state when the input terminal becomes at a predetermined level; and a synaptic circuit connecting the neuron circuits.

12. A switch circuit comprising:

an input terminal to which an input signal is input;

an output terminal; and a switch element including:

a first end coupled to the input terminal, a second end coupled to the output terminal, and a resistor that is connected between the first end and the second end, is in a high resistance state when an internal state quantity is less than a first threshold value, is in a low resistance state, of which a resistance value is less than that of the high resistance state, when the internal state quantity is greater than a second threshold value, wherein the internal state quantity $S(T_0)$ at time $T_0$ is $$S(T_0) = \int_0^{T_0} f(V_{10}(T_0-T)) e^{-T/\tau_{dec}} dT$$

where a voltage between the first end and the second end is represented by $V_{10}$, an effect of $V_{10}$ on an internal state quantity is represented by $f(V_{10})$, and a relaxation time of the internal state quantity is represented by $\tau_{dec}$, and a cycle period of variation in the input signal is shorter than the relaxation time.

13. The switch circuit according to claim 12, wherein the input signal is a plurality of spike signals, and an interval of the plurality of spike signals is shorter than the relaxation time.

14. The switch circuit according to claim 12, wherein the resistor is in a metallic phase at a predetermined temperature or greater and is in an insulator phase at the predetermined temperature or less, and $f(V_{10}) = A \times V_{10}^2$ where A represents a constant.

* * * * *